United States Patent
Cok et al.

(10) Patent No.: US 10,714,001 B2
(45) Date of Patent: Jul. 14, 2020

(54) MICRO-LIGHT-EMITTING-DIODE DISPLAYS

(71) Applicant: X Display Company Technology Limited, Dublin (IE)

(72) Inventors: Ronald S. Cok, Rochester, NY (US); Matthew Alexander Meitl, Durham, NC (US); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/033,159

(22) Filed: Jul. 11, 2018

(65) Prior Publication Data

US 2020/0020676 A1    Jan. 16, 2020

(51) Int. Cl.
    *G09G 3/3225*      (2016.01)
    *H01L 25/16*      (2006.01)
    (Continued)

(52) U.S. Cl.
    CPC ............. *G09G 3/3225* (2013.01); *G09G 3/32* (2013.01); *H01L 25/048* (2013.01);
    (Continued)

(58) Field of Classification Search
None
See application file for complete search history.

(56) References Cited

U.S. PATENT DOCUMENTS 5,550,066 A    8/1996   Tang et al.
5,748,161 A    5/1998   Lebby et al.
(Continued)

FOREIGN PATENT DOCUMENTS

JP    2002-261335 A    9/2002
JP    2010-103186 A    5/2010
(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Moazzam Hossain
*Assistant Examiner* — Stanetta D Isaac
(74) *Attorney, Agent, or Firm* — William R. Haulbrook; Michael D. Schmitt; Choate, Hall & Stewart LLP

(57) ABSTRACT

An exemplary active-matrix display comprises pixels disposed in a pixel array and pixel micro-controllers disposed in a controller array on a display substrate. Each of the pixels comprises micro-light-emitting elements that emit different color light. Each of the pixel micro-controllers is electrically connected to control the micro-light-emitting elements in each of two or more adjacent pixels in the pixel array. A spatial separation between pixels is greater than a spatial separation between the micro-light-emitting elements and is greater than a size of each of the micro-light-emitting elements. The micro-light-emitting elements in each of the pixels are disposed in a common pixel direction orthogonal to a pixel micro-controller center line an element distance substantially equal to or greater than one quarter of the extent of the pixel micro-controller in the common pixel direction from the center line. The pixel direction for each pixel controlled by a common pixel micro-controller is different.

35 Claims, 33 Drawing Sheets

(51) Int. Cl.

| | |
|---|---|
| H01L 25/075 | (2006.01) |
| H01L 25/065 | (2006.01) |
| H01L 25/04 | (2014.01) |
| H01L 27/32 | (2006.01) |
| H01L 27/15 | (2006.01) |
| G09G 3/32 | (2016.01) |
| H01L 25/00 | (2006.01) |
| H01L 23/00 | (2006.01) |
| G09G 3/20 | (2006.01) |

(52) U.S. Cl.
CPC ...... *H01L 25/0655* (2013.01); *H01L 25/0753* (2013.01); *H01L 25/167* (2013.01); *H01L 27/156* (2013.01); *H01L 27/326* (2013.01); *H01L 27/3218* (2013.01); *H01L 27/3255* (2013.01); *H01L 27/3276* (2013.01); *G09G 3/2003* (2013.01); *G09G 2300/0443* (2013.01); *G09G 2300/0452* (2013.01); *G09G 2300/0465* (2013.01); *G09G 2300/0804* (2013.01); *H01L 24/32* (2013.01); *H01L 25/50* (2013.01); *H01L 27/3213* (2013.01); *H01L 2224/32145* (2013.01); *H01L 2224/32225* (2013.01)

(56) References Cited

U.S. PATENT DOCUMENTS

| | | |
|---|---|---|
| 5,815,303 A | 9/1998 | Berlin |
| 5,886,401 A | 3/1999 | Liu |
| 5,994,722 A | 11/1999 | Averbeck et al. |
| 6,142,358 A | 11/2000 | Cohn et al. |
| 6,552,740 B1 | 4/2003 | Wong et al. |
| 6,574,032 B1 | 6/2003 | Roddy et al. |
| 6,756,576 B1 | 6/2004 | McElroy et al. |
| 7,012,382 B2 | 3/2006 | Cheang et al. |
| 7,195,733 B2 | 3/2007 | Rogers et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,990,058 B2 | 8/2011 | Cok et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,394,706 B2 | 3/2013 | Nuzzo et al. |
| 8,440,546 B2 | 5/2013 | Nuzzo et al. |
| 8,506,867 B2 | 8/2013 | Menard |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,835,940 B2 | 9/2014 | Hu et al. |
| 8,877,648 B2 | 11/2014 | Bower et al. |
| 8,889,485 B2 | 11/2014 | Bower |
| 8,895,406 B2 | 11/2014 | Rogers et al. |
| 8,896,505 B2 | 11/2014 | Cok et al. |
| 8,912,020 B2 | 12/2014 | Bedell et al. |
| 8,987,765 B2 | 3/2015 | Bibl et al. |
| 9,105,714 B2 | 8/2015 | Hu et al. |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,358,775 B2 | 6/2016 | Bower et al. |
| 9,362,348 B2 | 6/2016 | Lowenthal et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,520,537 B2 | 12/2016 | Bower et al. |
| 9,537,069 B1 | 1/2017 | Bower et al. |
| 9,583,533 B2 | 2/2017 | Hu et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2 | 12/2017 | Wu et al. |
| 9,860,955 B2 | 1/2018 | Kim et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,997,501 B2 | 6/2018 | Bower et al. |
| 10,078,239 B2 | 9/2018 | Sugita et al. |
| 2001/0022564 A1 | 9/2001 | Youngquist et al. |
| 2002/0096994 A1 | 7/2002 | Iwafuchi et al. |
| 2005/0194606 A1 | 9/2005 | Oohata |
| 2005/0264472 A1 | 12/2005 | Rast |
| 2005/0275615 A1 | 12/2005 | Kahen et al. |
| 2006/0063309 A1 | 3/2006 | Sugiyama et al. |
| 2006/0289972 A1 | 12/2006 | Nishimura et al. |
| 2008/0108171 A1 | 5/2008 | Rogers et al. |
| 2008/0211734 A1 | 9/2008 | Huitema et al. |
| 2009/0146921 A1 | 6/2009 | Takahashi |
| 2009/0278142 A1 | 11/2009 | Watanabe et al. |
| 2010/0060553 A1 | 3/2010 | Zimmerman et al. |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0201253 A1 | 8/2010 | Cok et al. |
| 2010/0207852 A1 | 8/2010 | Cok |
| 2010/0248484 A1 | 9/2010 | Bower et al. |
| 2010/0270912 A1 | 10/2010 | Ko |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0309378 A1 | 12/2011 | Lau et al. |
| 2012/0018745 A1 | 1/2012 | Liu et al. |
| 2012/0126229 A1 | 5/2012 | Bower |
| 2012/0193652 A1 | 8/2012 | Horng et al. |
| 2012/0206428 A1 | 8/2012 | Cok |
| 2012/0206499 A1 | 8/2012 | Cok |
| 2012/0212465 A1 | 8/2012 | White et al. |
| 2012/0228669 A1 | 9/2012 | Bower et al. |
| 2012/0314388 A1 | 12/2012 | Bower et al. |
| 2012/0320308 A1 | 12/2012 | Yeo et al. |
| 2012/0320581 A1 | 12/2012 | Rogers et al. |
| 2013/0010405 A1 | 1/2013 | Rothkopf et al. |
| 2013/0015483 A1 | 1/2013 | Shimokawa et al. |
| 2013/0036928 A1 | 2/2013 | Rogers et al. |
| 2013/0069275 A1 | 3/2013 | Menard et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0221355 A1 | 8/2013 | Bower et al. |
| 2013/0248889 A1 | 9/2013 | Lin |
| 2013/0249375 A1 | 9/2013 | Panagotacos et al. |
| 2013/0273695 A1 | 10/2013 | Menard et al. |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084482 A1 | 3/2014 | Hu et al. |
| 2014/0085214 A1 | 3/2014 | Cok |

(56) References Cited

U.S. PATENT DOCUMENTS

| | | |
|---|---|---|
| 2014/0094878 A1 | 4/2014 | Gossler et al. |
| 2014/0111442 A1 | 4/2014 | Cok et al. |
| 2014/0159043 A1 | 6/2014 | Sakariya et al. |
| 2014/0159065 A1 | 6/2014 | Hu et al. |
| 2014/0192079 A1 | 7/2014 | Lee et al. |
| 2014/0198373 A1 | 7/2014 | Ray |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0015517 A1 | 1/2015 | Zhao |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0170602 A1 | 6/2015 | Kang |
| 2015/0255438 A1 | 9/2015 | Oraw et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2016/0103547 A1 | 4/2016 | Lu et al. |
| 2016/0211245 A1 | 7/2016 | Do |
| 2016/0260388 A1 | 9/2016 | Yata et al. |
| 2016/0343772 A1 | 11/2016 | Bower et al. |
| 2016/0351539 A1 | 12/2016 | Bower et al. |
| 2016/0370855 A1 | 12/2016 | Lanier et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1* | 6/2017 | Cok .................. H04N 5/376 |
| 2017/0206845 A1 | 7/2017 | Sakariya et al. |
| 2017/0221266 A1 | 8/2017 | Schubert et al. |
| 2017/0250167 A1 | 8/2017 | Bower et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0338374 A1 | 11/2017 | Zou et al. |
| 2017/0352646 A1 | 12/2017 | Bower et al. |
| 2017/0352647 A1 | 12/2017 | Raymond et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0174932 A1 | 6/2018 | Cok et al. |
| 2018/0197471 A1 | 7/2018 | Rotzoll et al. |
| 2018/0211945 A1 | 7/2018 | Cok et al. |
| 2018/0226386 A1 | 8/2018 | Cok |
| 2018/0277525 A1 | 9/2018 | Cok et al. |
| 2018/0323180 A1 | 11/2018 | Cok |
| 2018/0340681 A1 | 11/2018 | Cok |

FOREIGN PATENT DOCUMENTS

| | | |
|---|---|---|
| JP | 2013-221965 A | 10/2013 |
| WO | WO-2006/027730 A1 | 3/2006 |
| WO | WO-2010/111601 A2 | 9/2010 |
| WO | WO-2010/132552 A1 | 11/2010 |
| WO | WO-2013/011415 A1 | 1/2013 |
| WO | WO-2013/064800 A1 | 5/2013 |
| WO | WO-2014/149864 A1 | 9/2014 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Hamer et al., 63.2: AMOLED Displays Using Transfer-Printed Integrated Circuits, SID 09 Digest, 40(2):947-950 (2009).

Ogihara, Mitsuhiko, Latest Trend of High Definition LED Printheads, Oki Technical Review, 208(73)(4):28-31, 2006.

Yoon, J. et al., Heterogeneously Integrated Optoelectronic Devices Enabled by MicroTransfer Printing, Adv. Optical Mater. 3:1313-1335 (2015).

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100, (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

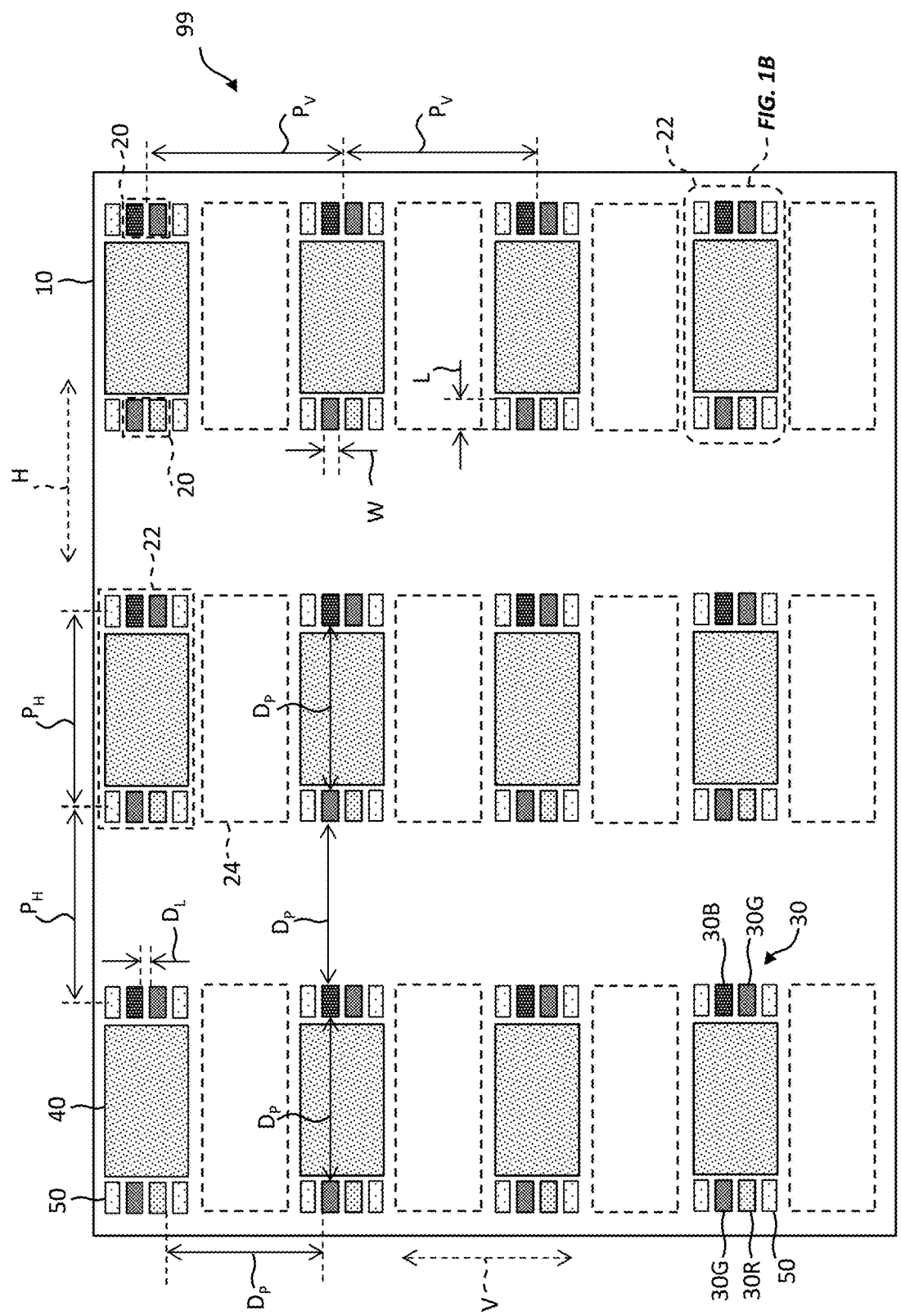

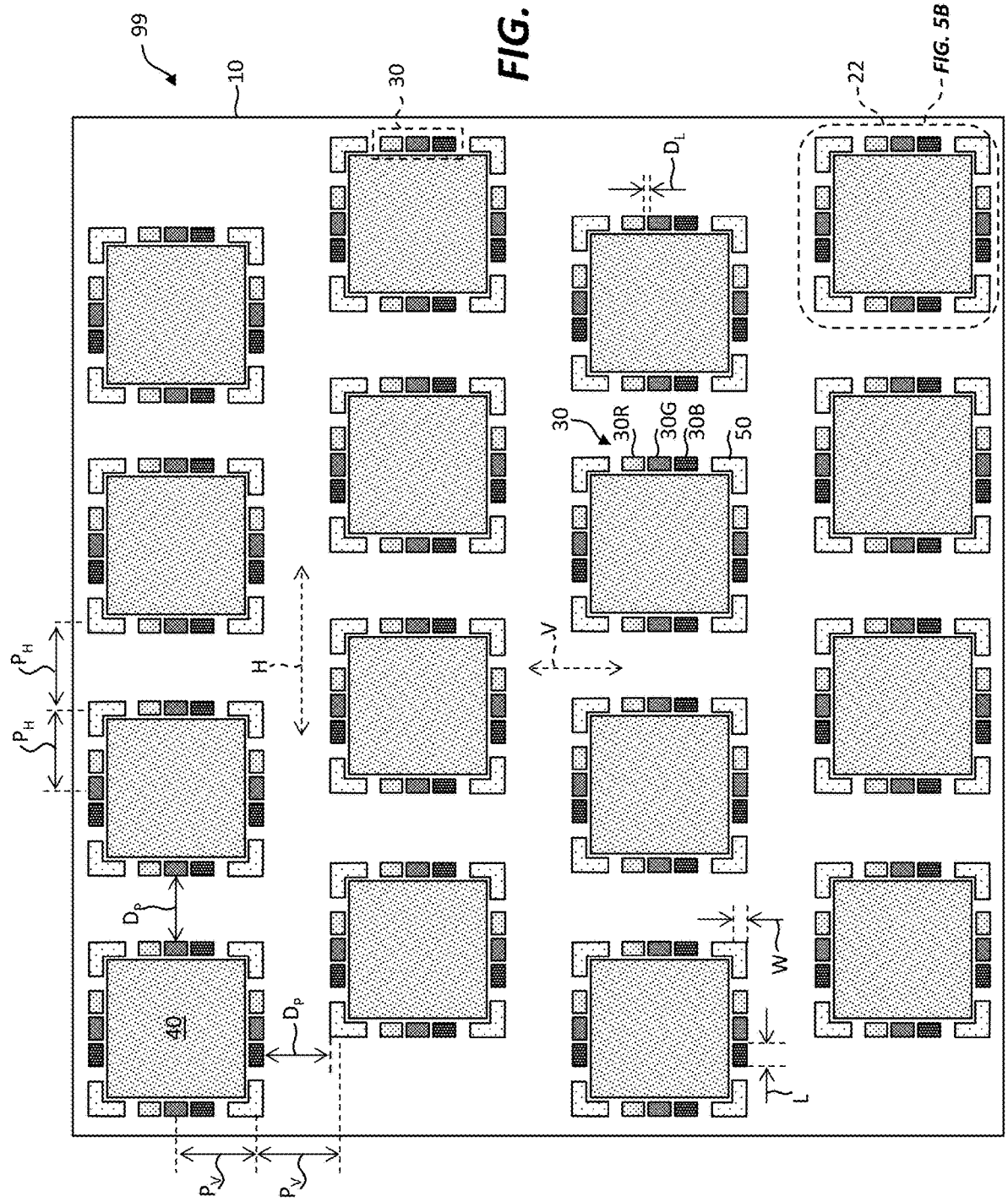

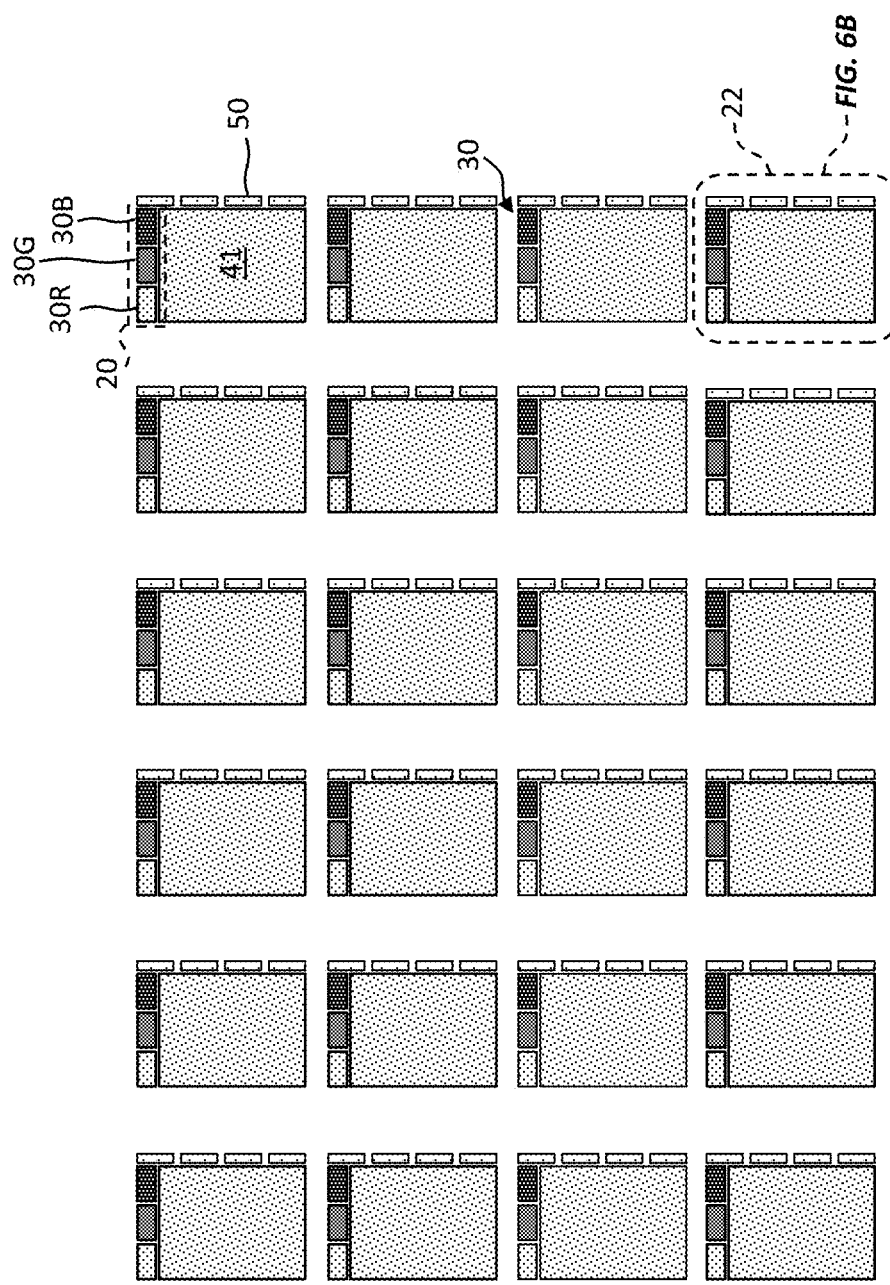

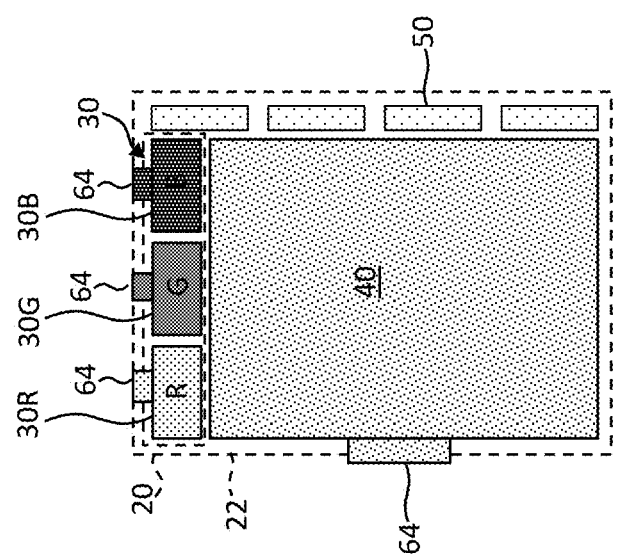

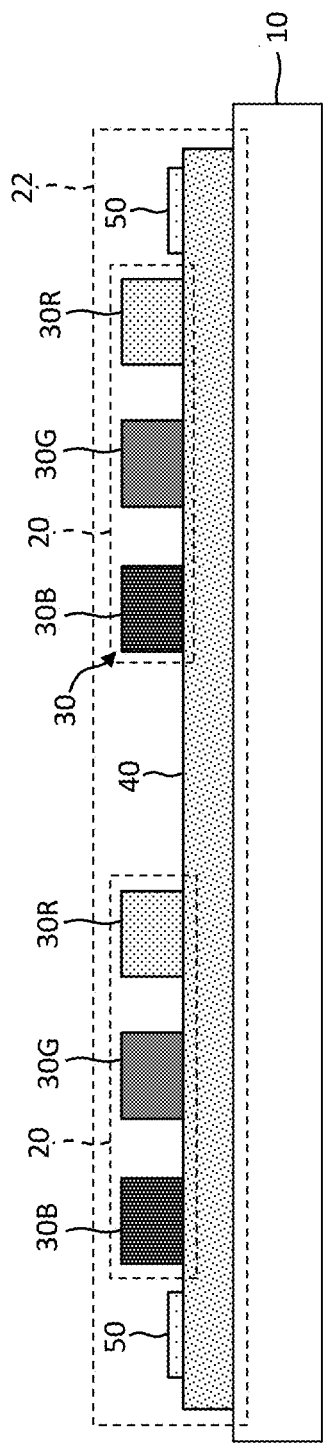
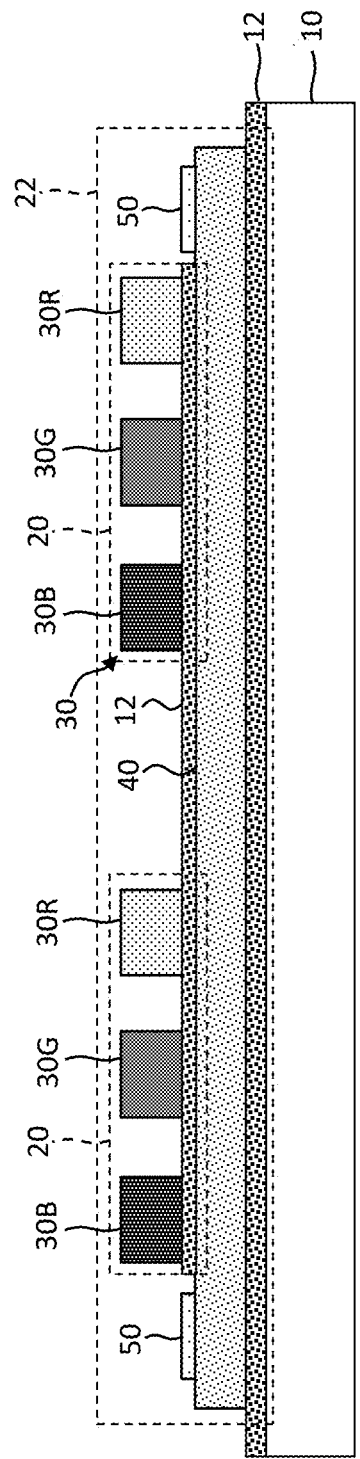
FIG. 14A
FIG. 14B

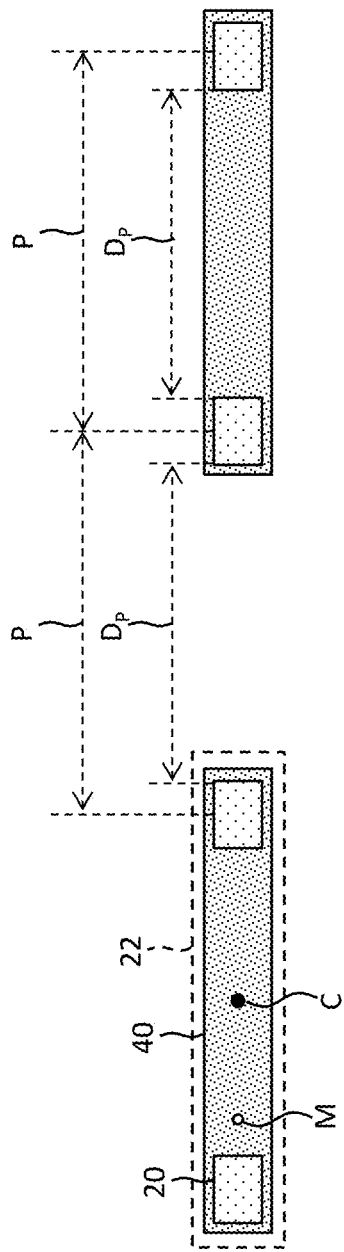
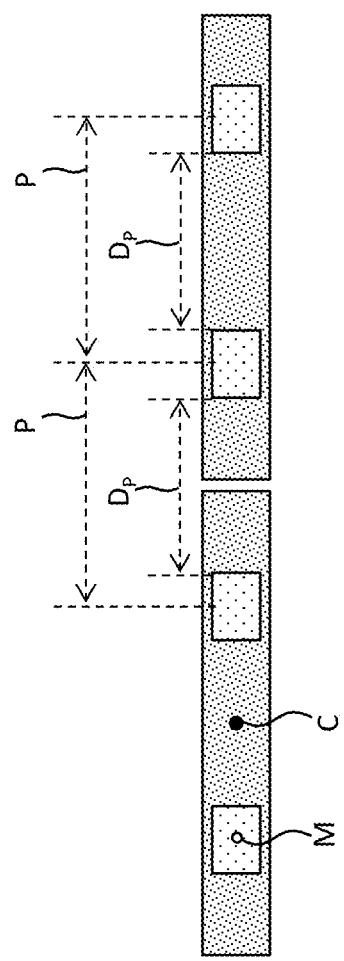
FIG. 16A
FIG. 16B

MICRO-LIGHT-EMITTING-DIODE DISPLAYS

TECHNICAL FIELD

The present invention relates generally to micro-light-emitting diode flat-panel displays and, in some embodiments, particularly to active-matrix displays.

BACKGROUND

Flat-panel displays are widely used in a variety of applications, for example in conjunction with computers, in portable hand-held devices, and for entertainment devices such as televisions. Such flat-panel displays typically employ an array of picture elements (pixels) distributed in rows and columns on a display substrate in a display area to display images, graphics, or text. In a color display, each pixel includes light emitters, transmitters, or reflectors that control light of different colors, such as red, green, and blue visible light. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (iLEDs) are also in widespread use for outdoor signage and have been demonstrated in a 55-inch television.

Pixels in a display are often controlled through a matrix-addressing scheme in which rows of pixels are connected to a common row-select line and columns of pixels are connected to a common column-data line. By enabling a row of pixels and concurrently providing data on all of the column-data lines, each pixel in the enabled row of pixels receives data from a corresponding column-data line at the same time. Each row of pixels is sequentially enabled to provide data to all of the display pixels. The row-select lines are typically controlled by a row controller and the column-data lines by a column controller. In conventional passive-matrix displays, each row emits, transmits, or reflects light sequentially as it is selected. In conventional active-matrix displays, a pixel control circuit is provided with each pixel that receives the row-select signals and column data signals, stores the data, and then controls the pixel to emit, transmit, or reflect light corresponding to the data even when the pixel's row is not selected.

In flat-panel displays such as LCDs or OLED displays, the pixel control circuits are provided in thin-film transistors patterned in a thin layer of amorphous or polycrystalline silicon on a display substrate. In LCDs, the pixels are typically provided in a layer above the thin-film layer and are as large as possible to provide a high fill factor for a bright display. In OLED displays, the pixels can be provided in the same layer as the OLEDs (typically for a bottom emitter) or are provided in a layer above the thin-film layer (typically for a top emitter) and are in any case as large as possible to provide a high fill factor with reduced current density for a bright display with a good lifetime. In another approach to providing active-matrix pixel control, pixels are controlled by micro-integrated circuits transfer printed to the display substrate.

Many large-format displays use inorganic light-emitting diodes (iLEDs) in the display pixels. However, such iLEDs are typically large (for example having a characteristic dimension of greater than one millimeter) and therefore limit the display resolution. Micro-iLEDs are known that have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a destination substrate such as a display substrate.

Flat-panel displays with improved characteristics and costs are actively being developed. There is an on-going need, therefore, for improved image display architectures for light-emitting diode displays having improved resolution, fewer or smaller micro-integrated circuits, and higher yields with reduced material and manufacturing costs.

SUMMARY

According to certain embodiments of the present invention, an active-matrix micro-light-emitting-diode display comprises a display substrate, pixels disposed in a pixel array on the display substrate, wherein each of the pixels comprises two or more micro-light-emitting elements that emit different colors of light, and pixel micro-controllers disposed in a controller array on the display substrate. Each of the pixel micro-controllers is electrically connected to and controls the two or more micro-light-emitting elements in each of two or more adjacent pixels in the pixel array. In at least one dimension over the extent of the display substrate, a spatial separation between pixels in each adjacent pair of pixels in the pixel array controlled by a common pixel micro-controller or between adjacent pairs of pixels in the pixel array controlled by different micro-controllers is greater than a spatial separation between the micro-light-emitting elements in at least one of the pixels in the pixel array and is greater than a size of each of the two or more micro-light-emitting elements in at least one of the pixels in the pixel array. All of the two or more micro-light-emitting elements in each of the pixels are disposed in a common pixel direction orthogonal to a center line of the pixel micro-controller an element distance substantially equal to or greater than one quarter of the extent of the pixel micro-controller in the pixel direction from the center line and the pixel direction for each pixel controlled by a common pixel micro-controller is different. In some embodiments of the present invention, the at least one dimension is two dimensions.

According to certain embodiments of the present invention, the pixel micro-controllers are digital integrated circuit controllers.

Each of the pixels can comprise two micro-light-emitting elements that each emit a different color of light from any other micro-light-emitting element in the pixel, three micro-light-emitting elements that each emit a different color of light from any other micro-light-emitting element in the pixel, or four micro-light-emitting elements that each emit a different color of light from any other micro-light-emitting element in the pixel. Alternatively, in some embodiments of the present invention, not all of the micro-light-emitting elements of the two or more micro-light-emitting elements emit a different color of light. Those micro-light-emitting elements that emit a same color of light can have different attributes, such as different efficiencies, ranges, or luminance.

The two or more pixels electrically connected to be controlled by each of the pixel micro-controllers can comprise a first pixel and a second pixel, wherein the first pixel comprises only two micro-light-emitting elements, wherein the two micro-light-emitting elements of the first pixel are a first green micro-light-emitting element that emits green light and a red micro-light-emitting element that emits red light and the second pixel comprises only two micro-light-emitting elements, wherein the two micro-light-emitting elements of the second pixel are a second green micro-light-emitting element that emits green light and a blue micro-light-emitting element that emits blue light.

According to certain embodiments of the present invention, the two or more of the pixels are two pixels, are three pixels, or are four pixels.

According to certain embodiments of the present invention, each of the pixel micro-controllers has a substantially rectangular shape with a center and a length greater than a width over the extent or a surface of the display substrate, the substantially rectangular shape comprising a first side opposing a second side in the length direction, the two or more pixels electrically connected to the pixel micro-controller comprise a first pixel and a second pixel, the first pixel is closer to the first side than to the center or to a point mid-way between the center and the first side, and the second pixel is closer to the second side than to the center or to a point mid-way between the center and the second side.

According to certain embodiments of the present invention, each of the pixel micro-controllers has a substantially rectangular shape or a plus shape with a center and a length and a width over the extent of the display substrate. The substantially rectangular shape or plus shape comprises a first side opposing a second side in a first dimension, for example a length direction, the two or more pixels electrically connected to the pixel micro-controller comprise a first pixel and a second pixel, the first pixel is closer to the first side than to the center or to a point mid-way between the center and the first side, and the second pixel is closer to the second side than to the center or to a point mid-way between the center and the second side. The substantially rectangular shape or plus shape further comprises a third side opposing a fourth side in a second dimension orthogonal to the first dimension, for example a width direction, the two or more pixels further comprise a third pixel and a fourth pixel, the third pixel is closer to the third side than to the center or to a point mid-way between the center and the third side, and the fourth pixel is closer to the fourth side than to the center or to a point mid-way between the center and the fourth side, and wherein a distance between the first and second pixels is substantially the same as a distance between the third and fourth pixels.

According to certain embodiments of the present invention, each of the pixel micro-controllers and the two or more micro-light-emitting elements of each of the pixels are disposed directly on or adhered directly to the display substrate or a layer formed on the display substrate, for example an adhesive layer or layer of adhesive.

According to certain embodiments of the present invention, the micro-light-emitting-diode display comprises pixel substrates arranged in an array on the display substrate. For each of the pixels, the two or more micro-light-emitting elements and the pixel micro-controller electrically connected to control the pixel are disposed directly on or adhered directly to the pixel substrate or to a layer formed on the pixel substrate, such as an adhesive layer or layer of adhesive. According to certain embodiments of the present invention, each of the pixel substrates comprises a fractured or separated tether.

According to certain embodiments of the present invention, the two or more micro-light-emitting elements of each pixel are disposed directly on or adhered directly to the pixel micro-controller or to a layer formed on the pixel micro-controller, such as an adhesive layer or layer of adhesive, that is electrically connected to and controls the micro-light-emitting elements of the pixel. According to certain embodiments of the present invention, each of the pixel micro-controllers comprises a fractured or separated tether or each of the micro-light-emitting elements comprises a broken or separated tether, or both.

According to certain embodiments of the present invention, for each of the pixel micro-controllers, the pixel micro-controller and the two or more micro-light-emitting elements of the two or more pixels electrically connected to and controlled by the pixel micro-controller are a pixel unit and each pixel unit is separated from an adjacent pixel unit in a separation direction by a distance greater than or equal to a size of the pixel unit in the separation direction so that space is provided for a redundant pixel unit location between the pixel unit and the adjacent pixel unit over the display substrate in the separation direction.

According to certain embodiments of the present invention, for each of the pixel micro-controllers, the pixel micro-controller and the two or more micro-light-emitting elements of the two or more pixels electrically connected to and controlled by the pixel micro-controller are a pixel unit and the pixel units are closer together than the pixels over the display substrate in a same direction.

According to certain embodiments of the present invention, each of the pixel micro-controllers has an area over the display substrate that is larger than a combined area of each micro-light-emitting element of the two or more pixels electrically connected to and controlled by the pixel micro-controller. According to certain embodiments of the present invention, each of the pixel micro-controllers has an area over the display substrate that is larger than a combined area of the two or more pixels electrically connected to and controlled by the pixel micro-controller.

According to certain embodiments of the present invention, the pixels each have a non-unitary aspect ratio and some of the pixels are rotated with respect to others of the pixels. Each of the micro-light-emitting elements in the pixels can have a non-unitary aspect ratio and some of the micro-light-emitting elements in the pixels can be rotated with respect to others of the micro-light-emitting elements in the pixels. Each of the pixel micro-controllers and the micro-light-emitting elements in the pixels electrically connected to and controlled by the micro-controller can have a non-unitary aspect ratio and at least some of the micro-light-emitting elements in the pixels or the pixels can be rotated with respect to the pixel micro-controller.

According to certain embodiments of the present invention, the pixels in the array are disposed in aligned rows and aligned columns. According to certain embodiments of the present invention, the pixels in the array are disposed in rows and columns and alternating rows are offset in a row direction or alternating columns are offset in a column direction, or both.

According to certain embodiments of the present invention, each of the pixel micro-controllers and the pixels and micro-light-emitting elements in the pixels electrically connected to and controlled by the pixel micro-controller are a pixel unit, and the pixels in the pixel array are disposed in rows and columns, each column of pixels forms a zigzag pattern, adjacent columns are mirror reflections of each other, and a distance between pixels in a pixel unit is less than a distance between pixels in adjacent pixel units in a same direction.

According to certain embodiments of the present invention, for each pixel micro-controller, the two or more adjacent pixels comprise first and second pixels, and the micro-light-emitting-diode display comprises contact pads disposed substantially in a line between the first and second pixels.

According to certain embodiments of the present invention, each pixel micro-controller comprises pixel portions that each exclusively controls a pixel electrically connected to the pixel micro-controller, and a shared portion that provides control in common to all of the pixels electrically connected to the pixel micro-controller. The shared portion can comprise contact pads for receiving or providing electrical control signals.

According to certain embodiments of the present invention, each micro-light-emitting element has at least one of (i) a width from 2 to 100 μm (e.g., 2 to no more than 5 μm, 5 to no more than 10 μm, 10 to no more than 20 μm, 20 to no more than 50 μm, or 50 to no more than 100 μm), (ii) a length from 2 to 250 μm (e.g., 2 to no more than 5 μm, 5 to no more than 10 μm, 10 to no more than 20 μm, 20 to no more than 50 μm, 50 to no more than 100 μm, 100 to no more than 250 μm), and (iii) a thickness from 2 to 50 μm (e.g., 2 to no more than 5 μm, 5 to no more than 10 μm, 10 to no more than 20 μm, or 20 to no more than 50 μm).

According to certain embodiments of the present invention, each micro-light-emitting element of the two or more micro-light-emitting elements in at least one of the two or more pixels is an inorganic micro-light-emitting diode. According to certain embodiments of the present invention, each micro-light-emitting element of the two or more micro-light-emitting elements in at least one of the two or more pixels is an organic light-emitting diode. According to certain embodiments of the present invention, at least one of the micro-light-emitting elements of the two or more micro-light-emitting elements in at least one of the two or more pixels is an inorganic micro-light-emitting diode and at least one of the micro-light-emitting elements of the two or more micro-light-emitting elements in the pixel or another pixel commonly controlled by a pixel micro-controller is an organic micro-light-emitting diode.

According to certain embodiments of the present invention, the pixels each comprise three micro-light-emitting elements, a micro-light-emitting element that is a red organic micro-light-emitting diode that emits red light, a micro-light-emitting element that is a green organic micro-light-emitting diode that emits green light, and a micro-light-emitting element that is a blue inorganic micro-light-emitting diode that emits blue light. Each pixel micro-controller can control a first pixel and a second pixel of the two or more pixels.

According to some embodiments of the present invention, the first pixel can comprise a red organic micro-light-emitting diode that emits red light and a green organic micro-light-emitting diode that emits green light and the second pixel can comprise a blue inorganic micro-light-emitting diode that emits blue light and a green organic micro-light-emitting diode that emits green light. In some embodiments, the first pixel comprises only two micro-light-emitting elements, wherein the two micro-light-emitting elements of the first pixel are the red organic micro-light-emitting diode and the green organic micro-light-emitting diode, wherein the second pixel comprises only two micro-light-emitting elements, wherein the two micro-light-emitting elements of the second pixel are the blue inorganic micro-light-emitting diode and the green organic micro-light-emitting diode.

Certain embodiments of the present invention provide improved image display architectures for light-emitting diode displays having improved resolution, fewer or smaller micro-integrated circuits with reduced material costs, higher yields with reduced manufacturing costs, and improved visual quality.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a schematic plan view illustrating an exemplary micro-light-emitting diode display comprising pixels that each comprise two micro-light-emitting elements and pixel micro-controllers that each control two pixels in a configuration providing space for redundant pixels and pixel micro-controllers, according to illustrative embodiments of the present invention;

FIG. 5C is a schematic plan view illustrating an exemplary micro-light-emitting-diode display in a high-resolution configuration comprising pixel micro-controllers that each control four pixels and pixels that each comprise three light-emitting elements disposed at the edges of the pixel micro-controllers, according to illustrative embodiments of the present invention;

FIG. 6A is a schematic plan view illustrating a micro-light-emitting-diode display in a configuration comprising pixels that each comprise three light-emitting elements and pixel micro-controllers that each control one pixel, according to illustrative embodiments of the present invention;

FIG. 6B is a detail schematic of the micro-light-emitting-diode display illustrated in FIG. 6A and according to illustrative embodiments of the present invention;

FIG. 14A is a schematic cross section illustrating an exemplary arrangement of pixels and a pixel micro-controller comprising micro-light-emitting elements disposed directly on a pixel micro-controller, the pixel micro-controller disposed directly on a display substrate, according to illustrative embodiments of the present invention;

FIG. 14B is a schematic cross section illustrating an exemplary arrangement of pixels and a pixel micro-controller comprising micro-light-emitting elements adhered directly to a pixel micro-controller with an adhesive layer, the pixel micro-controller adhered directly to a display substrate with an adhesive layer, according to illustrative embodiments of the present invention;

FIGS. 14D and 14E illustrate a rectangular pixel micro-controller and FIG. 14F has a plus-shaped or cross-shaped pixel micro-controller;

FIGS. 16A and 16B illustrate different pixel arrangements in one dimension on a pixel micro-controller, according to illustrative embodiments of the present invention;

Figure 1B:
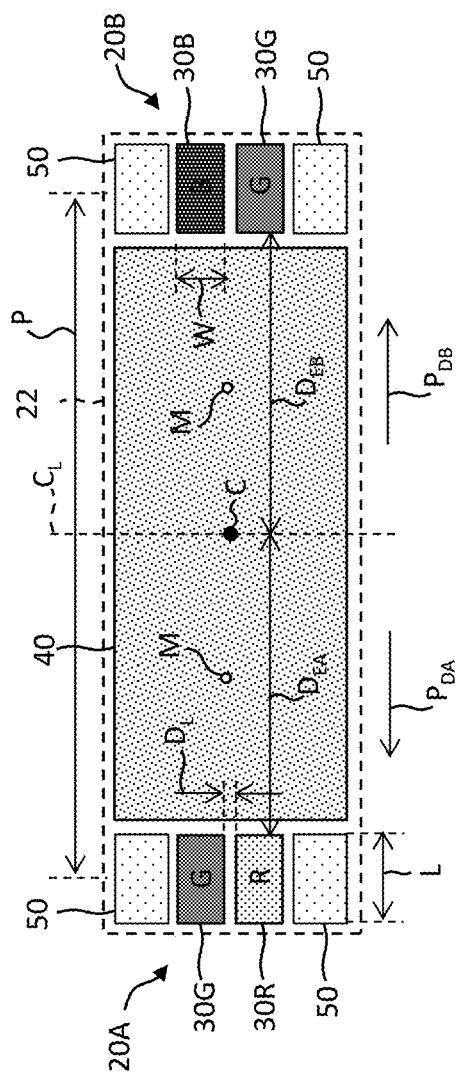
FIG. 1B is a detail schematic of the exemplary micro-light-emitting diode display illustrated in FIG. 1A and according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present invention provide an active-matrix micro-light-emitting-diode display with pixels and pixel micro-controllers disposed on or over a display substrate. Pixel micro-controllers control and drive two or more pixels that each comprise two or more micro-light-emitting elements, such as inorganic micro-light-emitting diodes. Shared control circuitry reduces a size of the pixel micro-controller, thereby reducing materials costs and a display fill factor. Pixels can comprise micro-light-emitting elements that are much smaller than a pixel micro-controller and can be located close together towards the ends of a pixel micro-controller. Moreover, micro-light-emitting elements in a pixel can be much smaller than a pixel spacing and can be disposed close together, forming small pixels that are clearly separated, increasing resolution and improving pixel color integration for the human visual system during viewing, as well as providing space over a display substrate for redundant pixels (e.g., without sacrificing resolution). Pixels (or components thereof, such as light-emitting elements) can be mounted directly on or adhered directly to a display substrate, a pixel substrate, or a pixel micro-controller, further increasing resolution and providing space for redundant pixels and pixel controllers over a display substrate.

Referring to the schematic plan view of FIG. 1A and the detail of FIG. 1B, in certain embodiments of the present invention, an active-matrix micro-light-emitting-diode display 99 comprises a display substrate 10, pixels 20 disposed in a pixel array on or over the display substrate 10, and pixel micro-controllers 40 disposed in a controller array on the display substrate 10. Pixels 20 in the pixel array can be arranged in rows of pixels 20 and columns of pixels 20, as shown in FIG. 1A. Each pixel 20 comprises two or more micro-light-emitting elements 30 that emit different colors of light. Micro-light-emitting elements 30 can each have an element substrate that is independent, distinct, and separate from a display substrate 10. Each pixel micro-controller 40 is electrically connected to control two or more micro-light-emitting elements 30 in each of two or more adjacent pixels 20 in a dimension in the pixel array, for example exclusively control (e.g., such that all micro-light-emitting elements 30 in a pixel are exclusively connected to one pixel micro-controller 40). Adjacent pixels 20 in a dimension are pixels 20 that have no intervening pixels 20 between the adjacent pixels 20 in the direction or dimension.

In at least one dimension over an extent (e.g., surface) of the display substrate 10, (i) a spatial separation between pixels 20 in each adjacent pair of pixels 20 in the pixel array controlled by a common pixel micro-controller 40 or between adjacent pairs of pixels 20 in the pixel array controlled by different pixel micro-controllers 40 is greater than a spatial separation between micro-light-emitting elements 30 in at least one pixel 20 in the pixel array, and (ii) the spatial separation between pixels 20 in each adjacent pair of pixels 20 in the pixel array controlled by a common pixel micro-controller 40 or between adjacent pairs of pixels 20 in the pixel array controlled by different pixel micro-controllers 40 is greater than a size of each of two or more micro-light-emitting elements 30 in at least one pixel 20 in the pixel array. As used herein, a dimension can be a direction over an extent of the display substrate 10, for example a surface of the display substrate 10 on or over which components (such as micro-light-emitting elements 30 or pixel micro-controllers 40) are disposed. In some embodiments, a dimension is substantially parallel to one or more edges of a substrate (e.g., a display substrate 10). In some embodiments, a dimension is not substantially parallel to any edge of a substrate (e.g., a display substrate 10). Two dimensions can be, but are not necessarily, orthogonal.

With reference still to FIGS. 1A and 1B, in certain embodiments, all micro-light-emitting elements 30 in each pixel 20 are disposed in a common pixel direction $P_D$ orthogonal to a center line $C_L$ of a pixel micro-controller 40 and disposed an element distance $D_E$ substantially equal to or greater than one half of the extent or distance of the pixel micro-controller 40 in pixel direction $P_D$ from the center line $C_L$. A pixel direction $P_D$ for each pixel 20 controlled by a common pixel micro-controller 40 from a center C of common pixel micro-controller 40 is different. Thus, each pixel 20 is disposed in a different pixel direction $P_D$ from a center C or center line $C_L$ of pixel micro-controller 40 that controls pixel 20. Micro-light-emitting elements 30 in a common pixel 20 can be disposed in a common pixel direction $P_D$ from a center C or center line $C_L$ of pixel micro-controller 40 that controls the micro-light-emitting elements 30 in common pixel 20. In contrast, micro-light-emitting elements 30 in different pixels 20 controlled by a common pixel micro-controller 40 will be disposed in different pixel directions $P_D$ from a center C or center line $C_L$ of common pixel micro-controller 40. A center line $C_L$ is a line through the center C of a pixel micro-controller 40, for example, but not necessarily a line of symmetry for pixel micro-controller 40. An element distance $D_E$ for each micro-light-emitting element 30 in a pixel 20 can be the same (as shown in FIG. 1B) or different (not shown in FIG. 1B but illustrated, for example, in FIGS. 11B, 15B and discussed below). In some embodiments, the at least one dimension is two dimensions, for example two orthogonal dimensions over an extent of the display substrate 10, such as horizontal H and vertical V dimensions.

With reference to the illustrative embodiments of FIGS. 1A and 1B, each pixel micro-controller 40 controls at least two pixels 20, for example two pixels 20 comprising a first pixel 20 and a second pixel 20, each pixel 20 comprising two micro-light-emitting elements 30. Micro-light-emitting elements 30 can have a width W and a length L over an extent of a display substrate 10, for example a surface of display substrate 10 on or over which components such as micro-light-emitting elements 30 or pixel micro-controllers 40 are disposed. Micro-light-emitting elements 30 can be square with an aspect ratio of one so that W equals L or can have a non-unitary aspect ratio so that the width W and length L are different. Conventionally, and as used herein, the longer dimension is referred to arbitrarily as the length L. In some embodiments, a first pixel 20 comprises only two micro-light-emitting elements 30: a red micro-light-emitting element 30R that emits red light and a green micro-light-emitting element 30G that emits green light. In some embodiments, a second pixel 20 comprises only two micro-light-emitting elements 30: a blue micro-light-emitting element 30B that emits blue light and a green micro-light-emitting element 30G that emits green light. (Red, green, or blue micro-light-emitting elements 30R, 30G, 30B are collectively or generally referred to as micro-light-emitting elements 30.) Red, green, or blue micro-light-emitting elements 30R, 30G, 30B in a pixel can be inorganic micro-light-emitting diodes (µILEDs), organic micro-light-emitting diodes (µOLEDs), or any combination of µILEDs and µOLEDs.

According to some embodiments of the present invention, adjacent pixels 20 in a pixel array are separated in a dimension by a distance $D_P$ and are disposed on a pixel pitch P. For example, a dimension can be a horizontal dimension H or a vertical dimension V over display substrate 10. A pixel pitch P is a distance defining the spatial frequency or repetition distance or spatial rate of pixels 20 in an array of pixels 20 in a direction or dimension. A pixel 20 can have a center or a centroid and a distance P between the centers or centroids of adjacent pixels 20 in a dimension can be a pixel pitch P in that dimension. In contrast, the separation distance between pixels 20 (e.g., pixel separation $D_P$) is measured from an edge (e.g., a closest edge for adjacent pixels 20) of a pixel 20. A pixel pitch P refers generically to a pixel pitch $P_H$ in the horizontal dimension H or a pixel pitch $P_V$ in the vertical dimension V. Adjacent pixels 20 in a pixel array can be separated by a distance (pixel spacing $D_P$) in both of two orthogonal dimensions (for example horizontal H and vertical V). A pixel spacing $D_P$ in both of the two orthogonal dimensions (e.g., H and V) can be the same, for example when horizontal and vertical pixel pitches $P_H$ and $P_V$ are the same and micro-light-emitting elements 30 are square. In some configurations, pixel spacing $D_P$ is not the same in both dimensions, but pixel pitch P is the same ($P_H$ equals $P_V$), for example if the micro-light-emitting elements 30 and pixels 20 are not square but the pixels 20 have equal pitches in two orthogonal dimensions (so that $P_H$ equals $P_V$, for example, as shown in FIG. 1A).

A pixel unit 22A comprises a single pixel micro-controller 40 together with the pixels 20 and micro-light-emitting elements 30 electrically connected to and controlled by the single pixel micro-controller 40. In some embodiments of the present invention, a spatial separation $D_P$ between adjacent pixels 20 electrically connected to and controlled by a common pixel micro-controller 40 in a dimension is the same as a spatial separation $D_P$ between adjacent pixels 20 electrically connected to and controlled by different pixel micro-controllers 40 in the dimension, as indicated in FIG. 1A. Micro-light-emitting elements 30 in a pixel 20 are spatially separated by a distance $D_L$, and can be spatially separated within a pixel 20 in a same direction as pixels 20 are separated in a pixel unit 22 or are spatially separated in a different direction, e.g., horizontal and vertical directions H, V, as also shown in FIG. 1A.

According to some embodiments of the present invention, a spatial separation $D_P$ between pixels 20 in each adjacent pair of pixels 20 in a common pixel unit 22 or between pixels 20 in adjacent different pixel units 22 in at least one dimension over an extent (e.g., surface) of a display substrate 10 is greater than a spatial separation $D_L$ between micro-light-emitting elements 30 in at least one pixel 20 in the pixel array, in either the same dimension or a different dimension. A spatial separation $D_P$ can be greater than a size (e.g., width W or length L) of each of two or more micro-light-emitting elements 30 in at least one pixel 20 in a pixel array. In some embodiments of the present invention, a spatial separation $D_P$ between adjacent pairs of pixels 20 is greater in a same dimension as the size of the two or more micro-light-emitting elements 30.

According to some embodiments of the present invention, all micro-light-emitting elements 30 in each pixel 20 are disposed in a common pixel direction $P_D$ with respect to pixel micro-controller 40 that controls the pixel 20. The direction $P_D$ is orthogonal to a center line $C_L$ of pixel micro-controller 40. All micro-light-emitting elements 30 in each pixel 20 are disposed an element distance $D_E$ that is substantially equal to or greater than one half of an extent distance of a pixel micro-controller 40 in a pixel direction $P_D$ from a center line $C_L$. Pixel direction $P_D$ for each pixel 20 controlled by a common pixel micro-controller 40 is different. In some embodiments of the present invention, some of the pixel directions $P_D$ are orthogonal to, or extend in an opposite direction from, other pixel directions $P_D$. Referring to the detail of FIG. 1B, a pixel 20A is disposed in a direction $P_{DA}$ an element distance $D_{EA}$ from center line $C_L$ and pixel 20B is disposed in an opposite direction $P_{DB}$ an element distance $D_{EB}$ from center line $C_L$. (Element distance $D_{EA}$ and element distance $D_{EB}$ are collectively referred to as element distances $D_E$.) Element distance $D_{EA}$ is equal to element distance $D_{EB}$ and both are greater than one quarter of a length of the pixel micro-controller 40 and greater than one half of the pixel micro-controller 40 from the center line $C_L$. By disposing micro-light-emitting elements 30 of each pixel 20 an element distance $D_E$ greater than one quarter of the length of pixel micro-controller 40 and greater than one half of the pixel micro-controller 40 from the center line $C_L$, micro-light-emitting elements 30 in a pixel 20 are closer to an edge of pixel micro-controller 40 than to a center C or center line $C_L$ of the pixel micro-controller 40. The pixel direction $P_D$ of each pixel 20 (pixel direction $P_{DA}$ for pixel 20A and pixel direction $P_{DB}$ for pixel 20B) is different. In the exemplary embodiment shown in FIG. 1B, micro-light-emitting elements 30 are disposed beyond an edge of pixel micro-controller 40 from a center C or center line $C_L$ of pixel micro-controller 40, providing greater separation between pixels 20 in a common pixel unit 22. A greater pixel separation $D_P$ and a smaller micro-light-emitting element separation $D_L$ provides improved color integration for a human viewer of the pixel 20, so that the separate micro-light-emitting elements 30 in a common pixel 20 are less likely to be distinguished by the human visual system of a viewer (e.g., in certain embodiments, are not distinguishable).

Figure 15A:
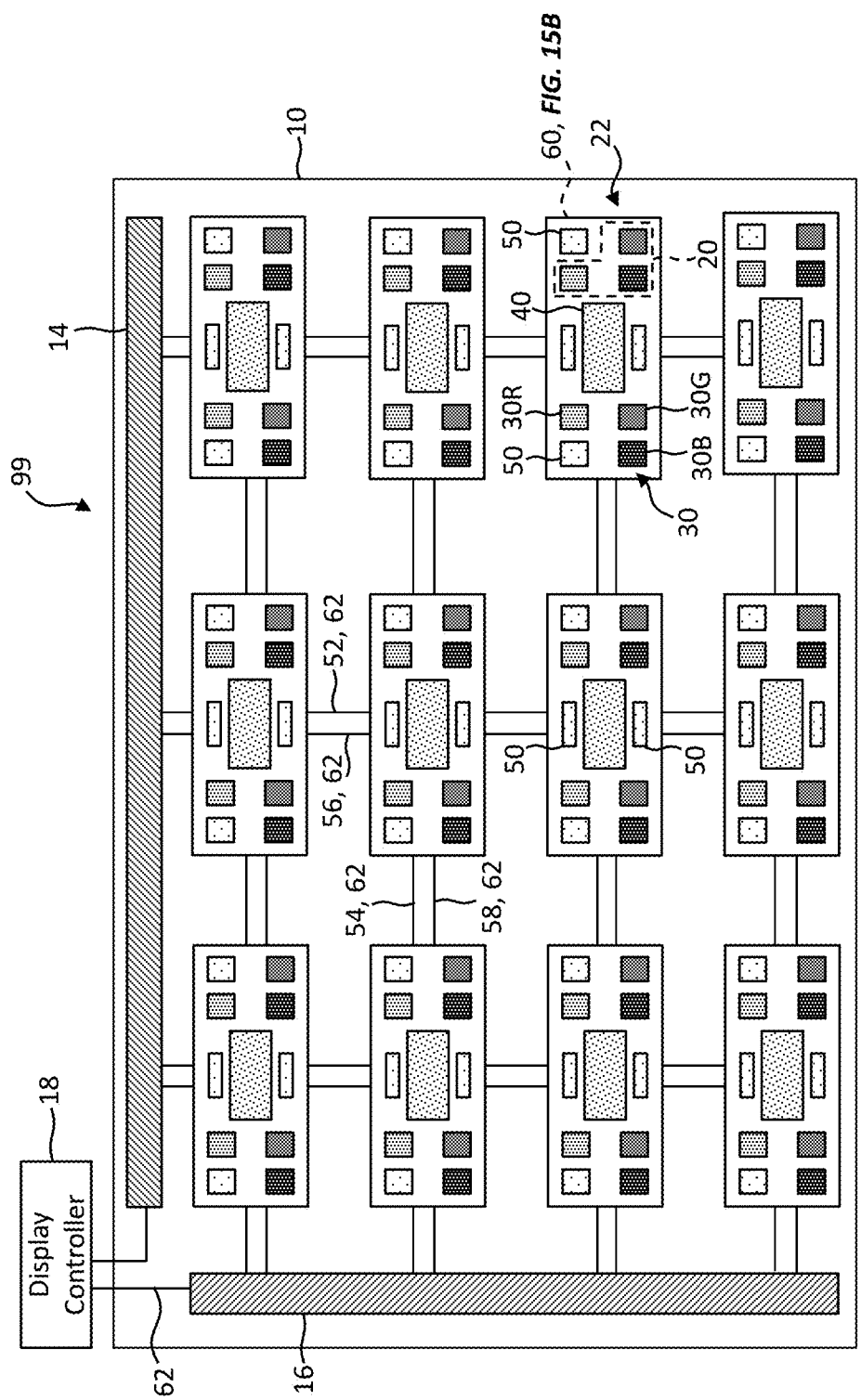
FIG. 15A is a schematic plan view illustrating an exemplary active-matrix micro-light-emitting-diode display in a configuration comprising pixel micro-controllers that each control two pixels and pixels that each comprise three micro-light-emitting elements, together with row, column, and display controllers, according to illustrative embodiments of the present invention.
Figure 15B:
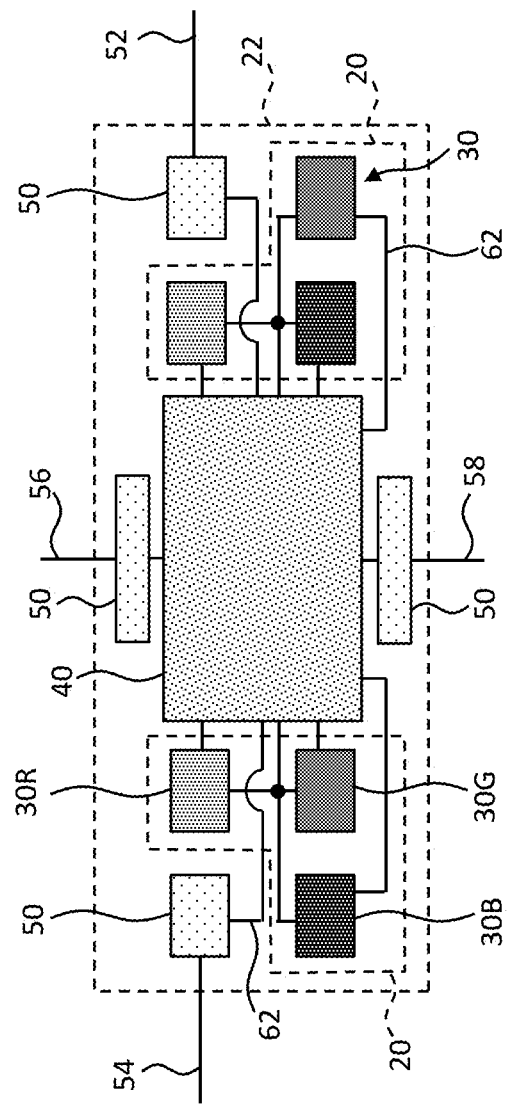
FIG. 15B is an electrical schematic illustrating an exemplary pixel unit corresponding to FIG. 15A, according to illustrative embodiments of the present invention.

In some embodiments of the present invention, all micro-light-emitting elements 30 of a pixel 20 are disposed in a line, as shown in FIG. 1A. The line can be parallel to a pixel direction $P_D$ for the pixel 20 (as shown in FIG. 11B, discussed below), or the line can extend in a different direction, for example an orthogonal direction, as shown in FIG. 1B. In some embodiments of the present invention, micro-light-emitting elements 30 of a pixel 20 are disposed in a two-dimensional arrangement, for example at the corners of a triangle (e.g., as shown in FIG. 15A and discussed further below).

A pixel micro-controller 40 can have a length greater than a width over a display substrate 10 and pixels 20 can be disposed at edges of a pixel micro-controller 40 in a length direction over an extent (e.g., surface) of the display substrate 10, for example adjacent to or beyond the edges in the length direction, as shown in FIG. 1B. As shown in FIG. 1B, pixels 20 can be disposed within the width of the pixel micro-controller 40 so that the pixels 20 do not extend in the width direction a distance farther than one half the width of the pixel micro-controller 40 from a center C or a center line $C_L$ of the pixel micro-controller 40 (e.g., a horizontal center line $C_L$, not shown in FIG. 1B).

In some embodiments of the present invention, pixel micro-controllers 40 are digital integrated circuit controllers that each include (e.g., incorporate) a digital circuit. Pixel units 22 can comprise contact pads 50 that provide an electrical contact and electrical connection to the digital circuits in the pixel micro-controllers 40. Contact pads 50 can be disposed on or be a part of pixel micro-controllers 40 or disposed adjacent to pixel micro-controllers 40 as a part of pixel units 22.

According to some embodiments of the present invention, a display substrate 10 can be any substrate capable of supporting pixels 20 and pixel micro-controllers 40, for example glass, plastic, ceramic, sapphire, or quartz substrates. Display substrates 10 found in the display industry, for example as used in liquid crystal displays or organic light-emitting diode displays are suitable. Display substrates 10 can be rigid or flexible. Generally, a display substrate 10 has a substantially planar surface with a much smaller thickness. For example, a display substrate 10 can have an area of 100 cm² to 10 m² and/or a thickness of 1 cm or less, 1 mm or less, 0.7 mm or less, 0.5 mm or less, or less. In certain embodiments, the extent of a display substrate 10 is taken over the larger substantially planar surface area on or over which the pixels 20 and pixel micro-controllers 40 are disposed.

Micro-light-emitting elements 30 in pixels 20 can be any suitable electrically controllable light emitter. According to some embodiments of the present invention, micro-light-emitting elements 30 are inorganic micro-light-emitting diodes (µILEDs), organic micro-light-emitting diodes (µOLEDs), or any combination of µILEDs and µOLEDs. In some embodiments of the present invention, micro-light-emitting elements 30 are µILEDs formed in compound semiconductor materials such as GaN or GaAs or similar materials with doped additives such as, for example, aluminum or phosphide and having micron-sized dimensions, for example at least one of (i) a width from 2 to 100 µm (e.g., 2 to no more than 5 µm, 5 to no more than 10 µm, 10 to no more than 20 µm, 20 to no more than 50 µm, or 50 to no more than 100 µm), (ii) a length from 2 to 250 µm (e.g., 2 to no more than 5 µm, 5 to no more than 10 µm, 10 to no more than 20 µm, 20 to no more than 50 µm, 50 to no more than 100 µm, 100 to no more than 250 µm), and (iii) a thickness from 2 to 50 µm (e.g., 2 to no more than 5 µm, 5 to no more than 10 µm, 10 to no more than 20 µm, or 20 to no more than 50 µm). Light-emitting diodes with such dimensions can be assembled using micro-transfer printing and can have an element substrate that is independent, distinct, and separate from a display substrate 10. Suitable µILEDs can be vertical µILEDs with electrode contacts on opposite sides of the µILED or horizontal µILEDs with electrode contacts on a same side of the µILED. In some embodiments, light-emitting elements 30 such as µILEDs can be disposed on (e.g., directly on), adhered to, or over a display substrate 10. According to some embodiments of the present invention, light-emitting elements 30 such as µILEDs are provided and disposed on or over display substrate 10 as unpackaged semiconductor integrated circuit devices, enabling smaller pixel unit 22 structures with better electronic and optical performance at higher resolution and with superior perceptual quality for active-matrix micro-light-emitting-diode displays 99.

Pixel micro-controllers 40 can be any circuit that controls two or more pixels 20 that each have two or more micro-light-emitting elements 30. Pixel micro-controllers 40 can be integrated circuits, for example silicon complementary metal-oxide semiconductors (CMOS), can be mixed-signal circuits incorporating both digital and analog circuits, or can be analog circuits, and can also be micron-sized, for example having dimensions over the extent of a display substrate 10 (e.g., a length or width) of less than or equal to 100, 80, 60, 40, or 20 microns and/or a thickness of less than or equal to 40, 20, 15, 10, 8, or 5 microns. Pixel micro-controllers 40 can be digital integrated circuit controllers, for example responsive to digital control signals and providing digital control to the micro-light-emitting elements 30, for example using temporal pulse width modulation at a constant current. In some embodiments, pixel micro-controllers 40 can be formed in, on (e.g., directly on), adhered to, or over a display substrate 10, for example in a thin-film semiconductor layer disposed on the display substrate 10. In some embodiments, pixel micro-controllers 40 can be formed in a micro-controller substrate that is separate, distinct, and independent from a display substrate 10, for example as an integrated circuit. Such integrated circuits can be formed in crystalline semiconductor materials that have a much greater electron mobility and much smaller transistors, providing electronic performance that is much superior to thin-film electronic devices and enabling much more complex and capable control of micro-light-emitting elements 30 in smaller devices. According to some embodiments of the present invention, pixel micro-controllers 40 are provided and disposed on or over a display substrate 10 as unpackaged semiconductor integrated circuit devices, enabling smaller pixel unit 22 structures with better electronic and optical performance at higher resolution and with superior perceptual quality for active-matrix micro-light-emitting-diode displays 99.

Some embodiments of the present invention, with reference to FIGS. 1A and 1B, have a substantially non-unitary aspect ratio with a length substantially larger than a width over a display substrate 10. In some such embodiments, micro-light emitting elements 30 are disposed at the ends of a pixel micro-controller 40 in the length direction so that pixel units 22 have a length much greater than a width so that more space is provided over a display substrate 10 between pixel units 22 in a vertical direction V than in a horizontal direction H. Since pixel pitch $P_H$ in the horizontal direction is equal to pixel pitch $P_V$ in the vertical direction, each pixel unit 22 is separated from an adjacent pixel unit 22 in a separation direction (e.g., vertical direction V) by a space greater than or equal to a size of pixel unit 22 in the separation direction so that space is provided for a redundant pixel unit location 24 between pixel unit 22 and an adjacent pixel unit 22 over the display substrate 10 in the separation direction (e.g., vertical direction V in FIG. 1A). If a pixel unit 22 fails, a redundant pixel unit 22 can be provided in the redundant pixel location 24 and electrically connected in parallel with the failed pixel unit 22 to provide light output from the redundant pixel unit 22 in place of the failed pixel unit 22, thus improving manufacturing yields for micro-light-emitting-diode displays 99. A redundant pixel unit 22 can be provided initially (e.g., prior to determining failure of a pixel unit 22) or after a failed pixel unit 22 has been determined. A redundant pixel unit 22 is a pixel unit 22 that is meant to behave substantially identically to another pixel unit 22.

Figure 2A:
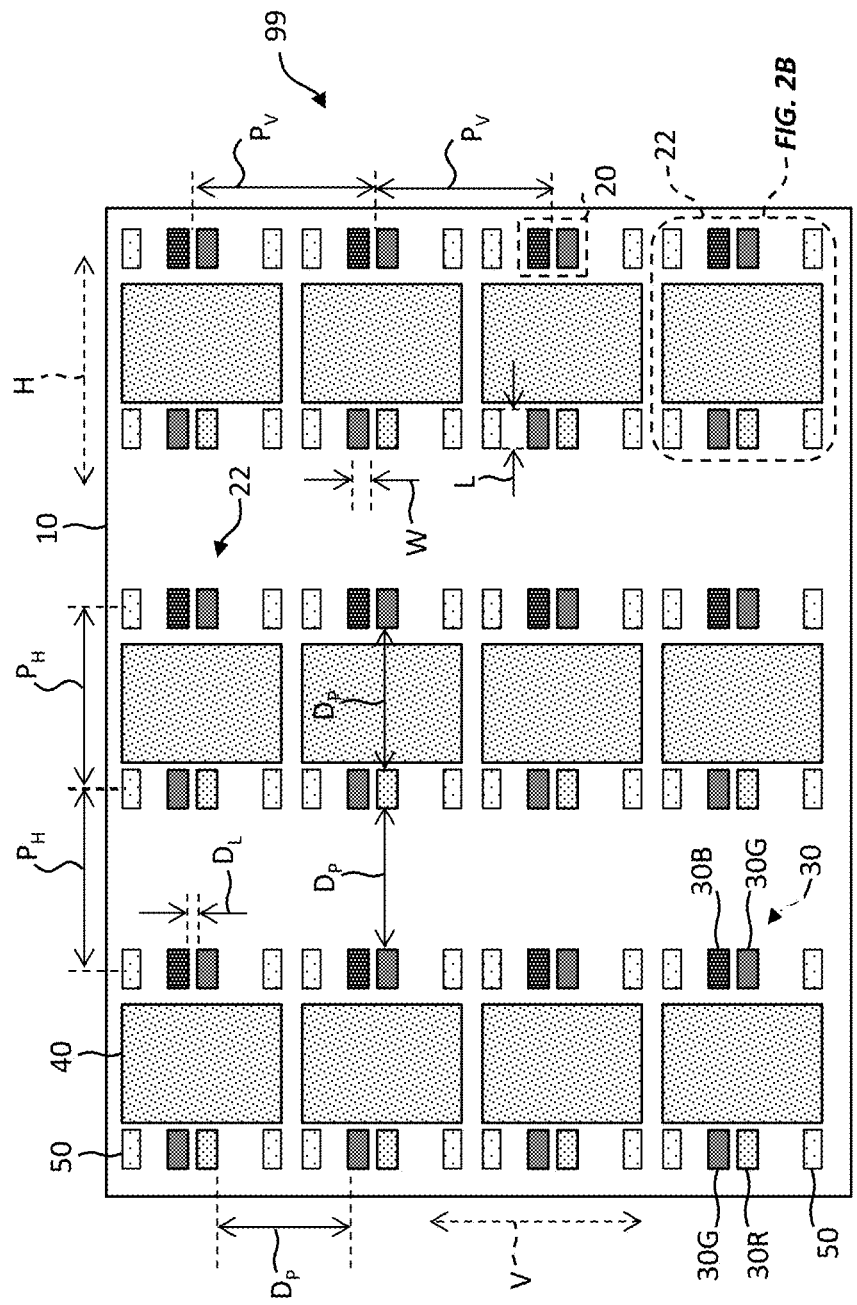
FIG. 2A is a schematic plan view illustrating an exemplary micro-light-emitting-diode display in a high-resolution configuration comprising pixels that each comprise two micro-light-emitting elements and pixel micro-controllers that each control two pixels, according to illustrative embodiments of the present invention.
Figure 2B:
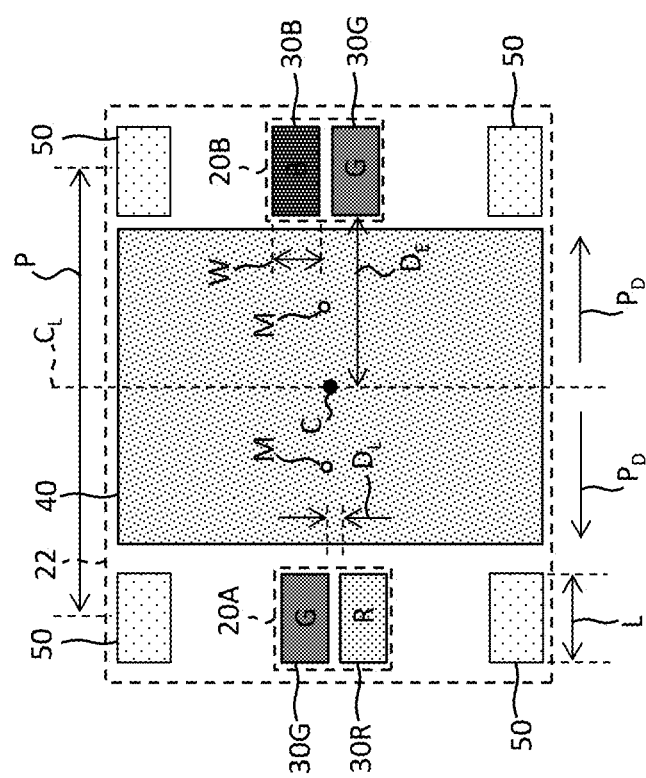
FIG. 2B is a detail schematic of the exemplary micro-light-emitting-diode display illustrated in FIG. 2A and according to illustrative embodiments of the present invention.

In some embodiments of the present invention, referring to FIG. 2A and the detail of FIG. 2B, pixel micro-controllers 40 having a different aspect ratio but substantially the same area as the exemplary embodiments illustrated in FIGS. 1A and 1B are disposed on or over a display substrate 10. The aspect ratio of the different pixel micro-controller 40 shown in FIGS. 2A and 2B is more square than a substantially longer aspect ratio of pixel micro-controllers 40 in FIGS. 1A and 1B, enabling a higher density of pixel units 22 and a higher-resolution micro-light-emitting-diode display 99. In some such embodiments, pixel units 22 are closer together than pixels 20 over a display substrate 10 in a same direction. For ease in comparison, the illustrated areas pixel micro-controllers 40 in FIGS. 1A and 1B are substantially the same as the illustrated areas of pixel micro-controllers 40 in FIGS. 2A and 2B. For clarity, contact pads 50 in FIGS. 2A and 2B are also the same size as in FIGS. 1A and 1B, but those knowledgeable in the electronic layout arts will appreciate that the unused area in pixel units 22 of FIGS. 2A and 2B can be used to increase a size of contact pads 50 or pixel micro-controllers 40 or even to permit the use of larger micro-light-emitting elements 30.

In some such exemplary embodiments as are illustrated in FIGS. 1A, 1B, 2A, and 2B, each pixel micro-controller 40 in a micro-light-emitting-diode display 99 has a substantially rectangular shape with a center C and a length greater than a width over an extent (e.g., surface) of a display substrate 10. The substantially rectangular shape comprises a first side opposing a second side in the length direction, where the length is greater than or equal to the width. Two or more pixels 20 electrically connected to a pixel micro-controller 40 can comprise a first pixel 20 and a second pixel 20. First pixel 20 can be closer to the first side than to a point M mid-way between the center C and the first side, and second pixel 20 can be closer to the second side than to a point M mid-way between the center C and the second side. Locating the first and second pixels 20 closer to the midpoint M can increase the density and resolution of pixels 20 on or over a display substrate 10.

According to some embodiments of the present invention, pixels 20 are relatively small and their micro-light-emitting elements 30 are spaced close together ($D_L$) compared to pixel micro-controller 40, pixel pitch P, and pixel spacing $D_P$. Thus, each pixel micro-controller 40 can have an area over a display substrate 10 that is larger than a combined area of each micro-light-emitting element 30 of the two or more pixels 20 electrically connected to and controlled by pixel micro-controller 40. Moreover, each pixel micro-controller 40 can have an area over a display substrate 10 that is larger than a combined area of the two or more pixels 20 electrically connected to and controlled by pixel micro-controller 40, providing relatively smaller pixels 20 with improved visual response for viewers.

The exemplary embodiments of FIGS. 1A, 1B, 2A, and 2B comprise two pixels 20 in each pixel unit 22 and two micro-light-emitting elements 30 in each pixel 20. According to some embodiments of the present invention, each of the two micro-light-emitting elements 30 in each pixel 20 emit different colors of light. In some embodiments and as noted above, each pixel micro-controller 40 is electrically connected to and controls at least a first pixel 20A and a second pixel 20B. First pixel 20A can comprise a first green micro-light-emitting element 30G that emits green light and a red micro-light-emitting element 30R that emits red light and second pixel 20B can comprise a second green micro-light-emitting element 30G that emits green light and a blue micro-light-emitting element 30B that emits blue light. Since the human visual system perceives high-frequency luminance primarily with green light and red and blue colors are not perceived with the same frequency response, two-color pixels 20, each with a green emitter can provide a spatially efficient display system with a reduced number of micro-light emitting elements 30 and an increased number of pixels 20 and pixel units 22 in micro-light-emitting-diode displays 99.

Referring to the exemplary embodiments of FIGS. 3A, 3B, 4A, and 4B, each pixel 20 comprises three micro-light-emitting elements 30, for example a red micro-light-emitting element 30R that emits red light, a green micro-light-emitting element 30G that emits green light, and a blue micro-light-emitting elements 30B that emits blue light. In some embodiments, each pixel 20 comprises four micro-light-emitting elements 30, for example emitting red, green, blue, and white light respectively, or emitting red, green, blue, and yellow light respectively, or emitting red, green, blue, and cyan light respectively. In general, pixels 20 can comprise any number of micro-light-emitting elements 30. Micro-light-emitting elements 30 within a pixel 20 can each emit a different color of light than any others of the micro-light-emitting elements 30 within a pixel 20. In some embodiments, some micro-light-emitting elements 30 within a common pixel 20 can emit a same color of light as another of the micro-light-emitting elements 30 within the pixel 20, for example to increase light output of a particular color or to provide redundancy. Those micro-light-emitting elements 30 in the common pixel 20 that emit a same color of light can have different attributes, such as different efficiencies, ranges, or luminance. For example, a pixel 20 in a pixel unit 22 can have two green micro-light-emitting elements 30G that are slightly different in a central frequency of emission, comprise different materials, have different external quantum efficiencies (EQEs), are driven at different currents, or have different structures, optical reflectors, or optical absorbers, or any combination of these.

Figure 3A:
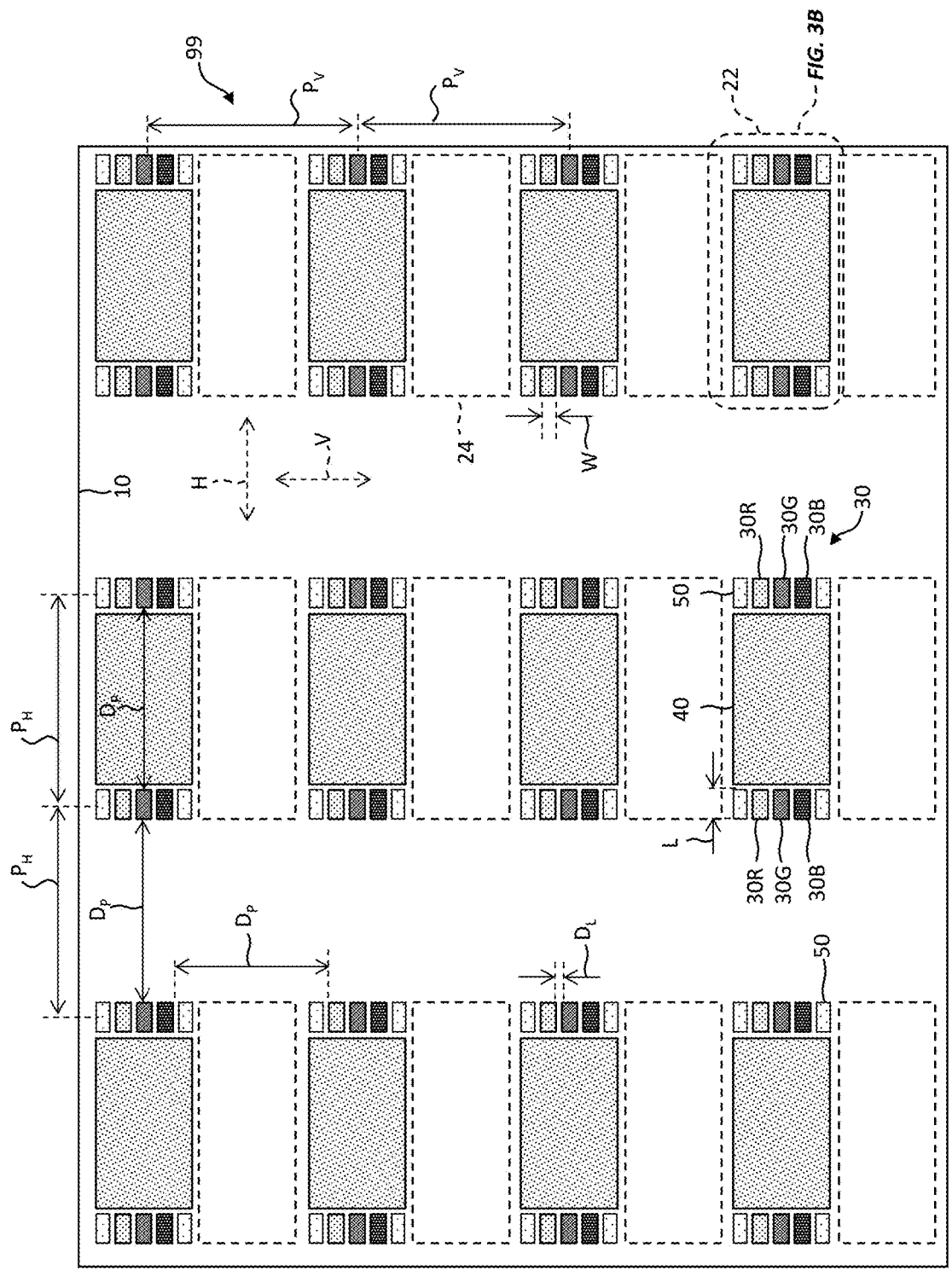
FIG. 3A is a schematic plan view illustrating an exemplary micro-light-emitting-diode display comprising pixels that each comprise three micro-light-emitting elements and pixel micro-controllers that each control two pixels in a configuration providing space for redundant pixels and pixel micro-controllers, according to illustrative embodiments of the present invention.
Figure 3B:
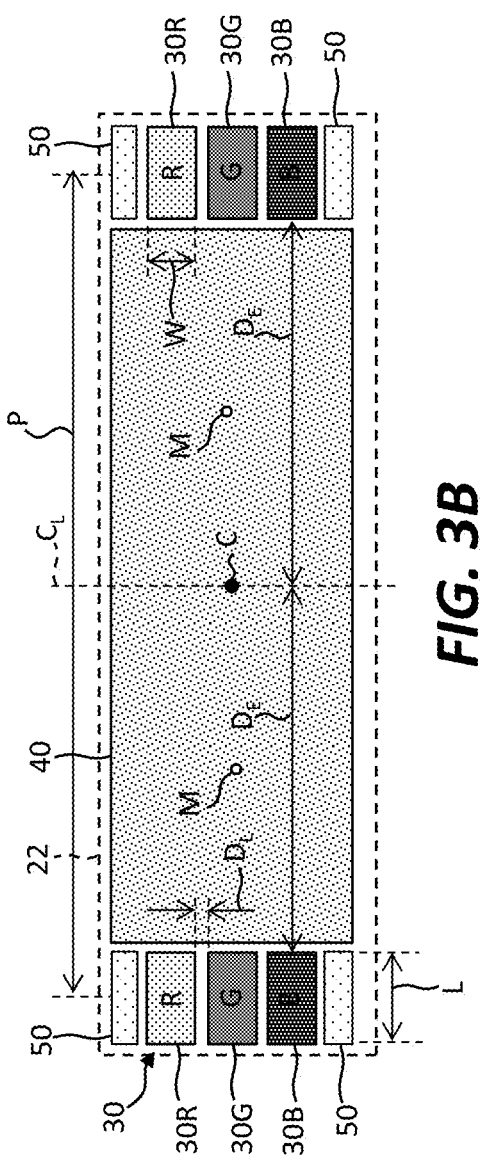
FIG. 3B is a detail schematic of the exemplary micro-light-emitting-diode display illustrated in FIG. 3A and according to illustrative embodiments of the present invention.
Figure 4A:
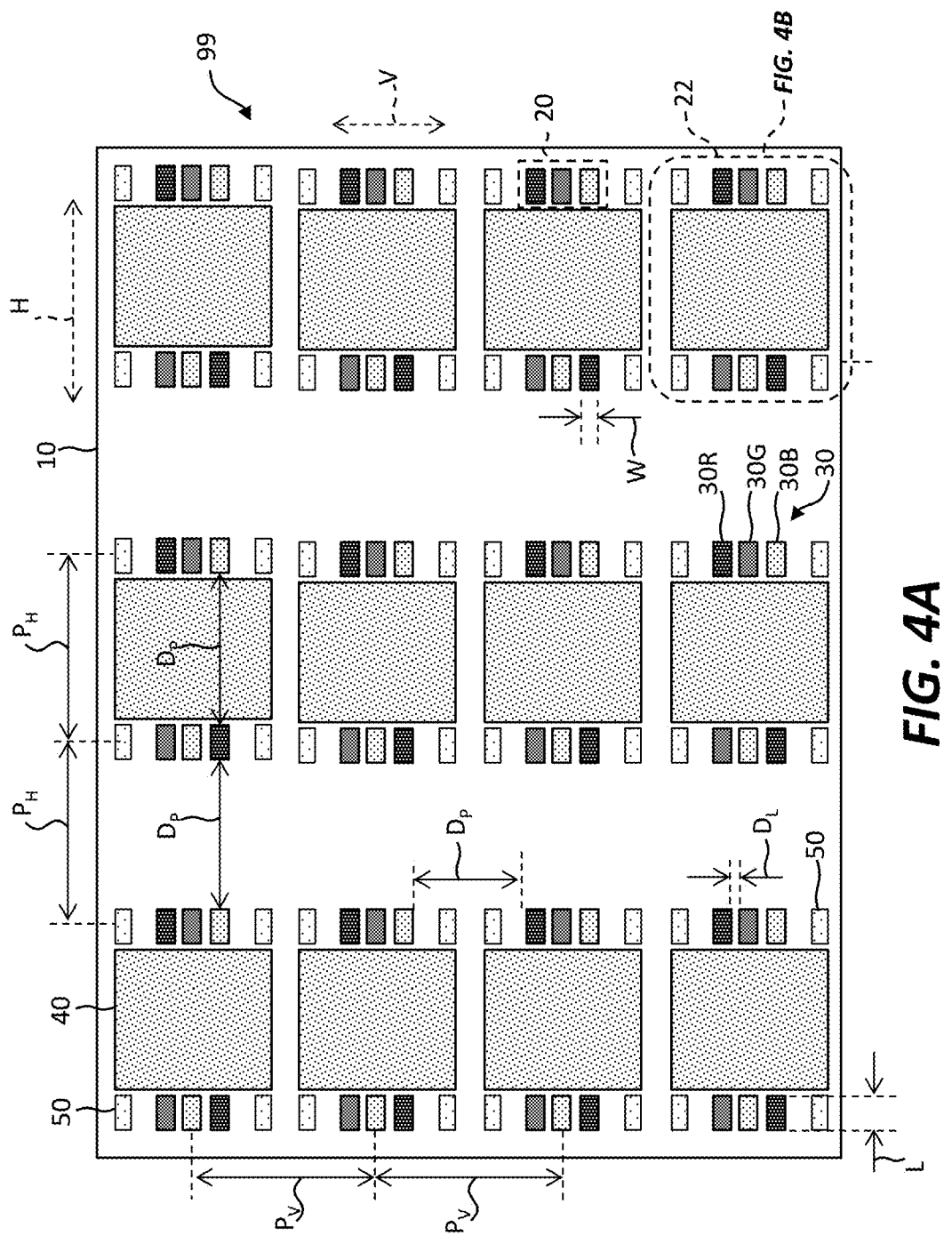
FIG. 4A is a schematic plan view illustrating an exemplary micro-light-emitting-diode display in a high-resolution configuration comprising pixel micro-controllers that each control two pixels and pixels that each comprise three micro-light-emitting elements, according to illustrative embodiments of the present invention.
Figure 4B:
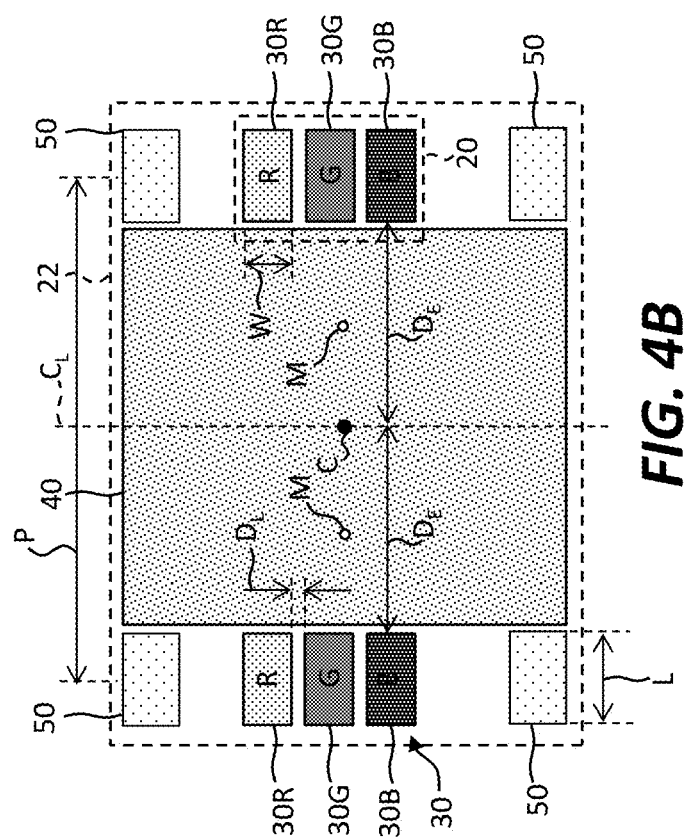
FIG. 4B is a detail schematic of the exemplary micro-light-emitting-diode display illustrated in FIG. 4A and according to illustrative embodiments of the present invention.

The exemplary embodiment of FIG. 3A and the detail of FIG. 3B comprises pixels 20 with three micro-light-emitting elements 30 in each pixel 20 and a pixel micro-controller 40 with a substantially non-unitary aspect ratio, corresponding to the illustrative embodiments of FIGS. 1A and 1B, thereby providing redundant pixel unit locations 24 between adjacent pixel units 22 in the vertical dimension V. Similarly, the illustrative embodiments of FIG. 4A and the detail of FIG. 4B are examples of micro-light-emitting-diode displays 99 with increased resolution, but without any redundant pixel unit locations 24.

Figure 5A:
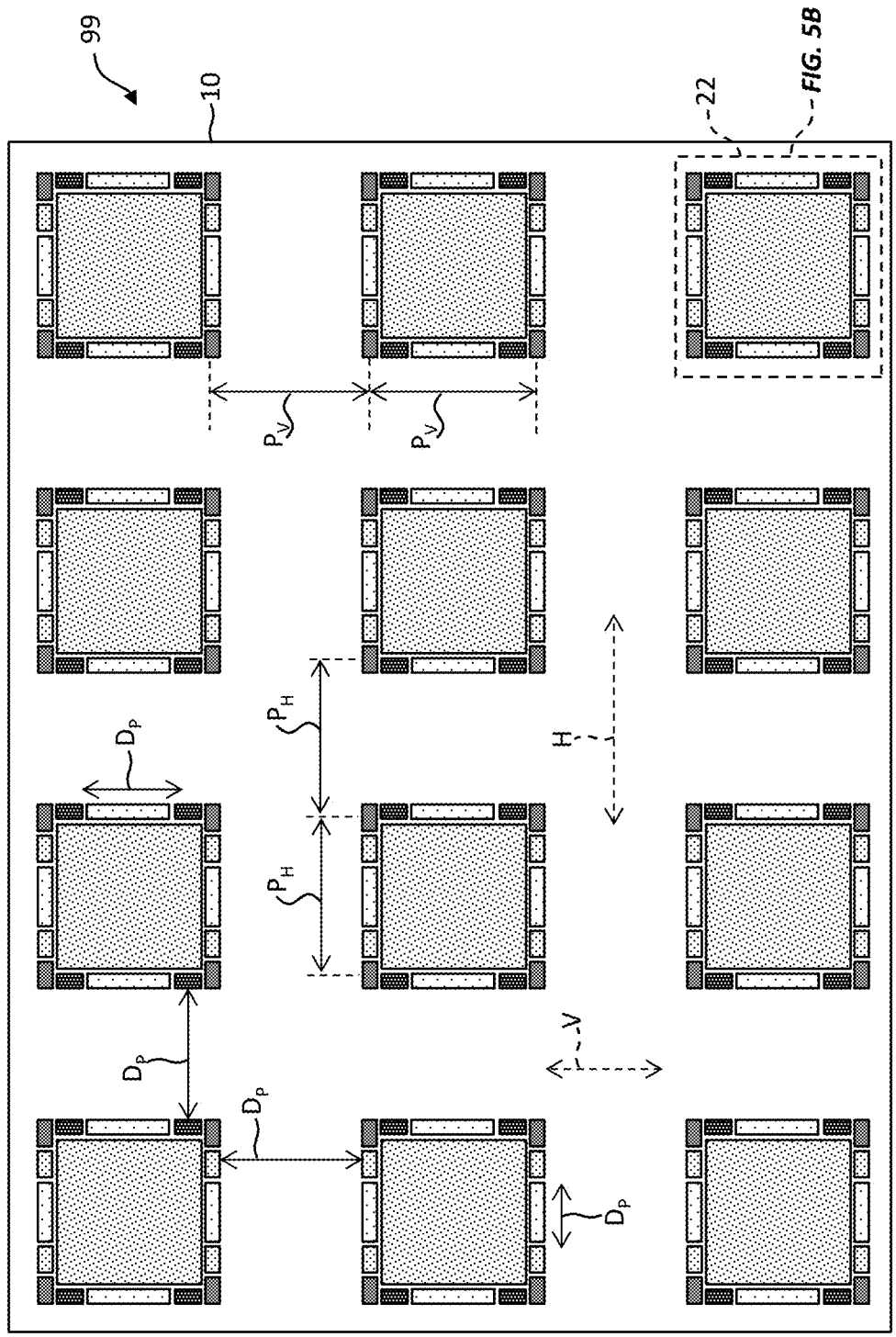
FIG. 5A is a schematic plan view illustrating an exemplary micro-light-emitting-diode display in a high-resolution configuration comprising pixel micro-controllers that each control four pixels and pixels that each comprise three light-emitting elements disposed at the corners of the pixel micro-controllers, according to illustrative embodiments of the present invention.

The illustrative embodiments of FIGS. 1A, 1B, 2A, 2B and FIGS. 3A, 3B, 4A, 4B all comprise pixel units 22 having two pixels 20 electrically connected to and controlled by each pixel micro-controller 40. In some embodiments of the present invention, a pixel micro-controller 40 can control three or four, or more, pixels 20. Referring to the illustrative embodiments of FIGS. 5A and 5B, each pixel unit 22 comprises a pixel micro-controller 40 that controls four pixels 20 with three micro-light-emitting elements 30 each: a red micro-light-emitting element 30R that emits red light, a green micro-light-emitting element 30G that emits green light, and a blue micro-light-emitting element 30B that emits blue light (totaling twelve micro-light-emitting elements 30). In FIG. 5A and the detail of FIG. 5B, micro-light-emitting elements 30 are disposed at the corners of a pixel micro-controller 40. In FIG. 5C and the detail of FIG. 5D, micro-light-emitting elements 30 are disposed at the sides of a pixel micro-controller 40. Although the embodiments of FIGS. 5A, 5B and FIGS. 5C, 5D comprise three micro-light-emitting elements 30 in each of four pixels 20, in some embodiments, a pixel 20 in accordance with any four of these exemplary embodiments could comprise only two micro-light-emitting elements 30 (e.g., as shown in FIGS. 1A and 1B).

In the illustrative embodiments of FIGS. 5A, 5B and FIGS. 5C, 5D, pixel micro-controllers 40 have a rectangular and substantially square shape with each pixel 20 disposed adjacent to each of the four corners (FIGS. 5A, 5B) or sides (FIGS. 5C, 5D) of the pixel micro-controllers 40. In some embodiments (e.g., as shown in FIG. 14F and discussed below), pixel micro-controllers 40 are plus-shaped (having a shape similar to a plus '+' sign or character), cross-shaped, or x-shaped (having a shape similar to an 'x' letter or character that is a rotated version of a plus sign shape) with each pixel 20 disposed adjacent to each of the four extended portions of the pixel micro-controllers 40 farthest from a center C or center-line $C_L$ of the pixel micro-controllers 40.

Figure 5B:
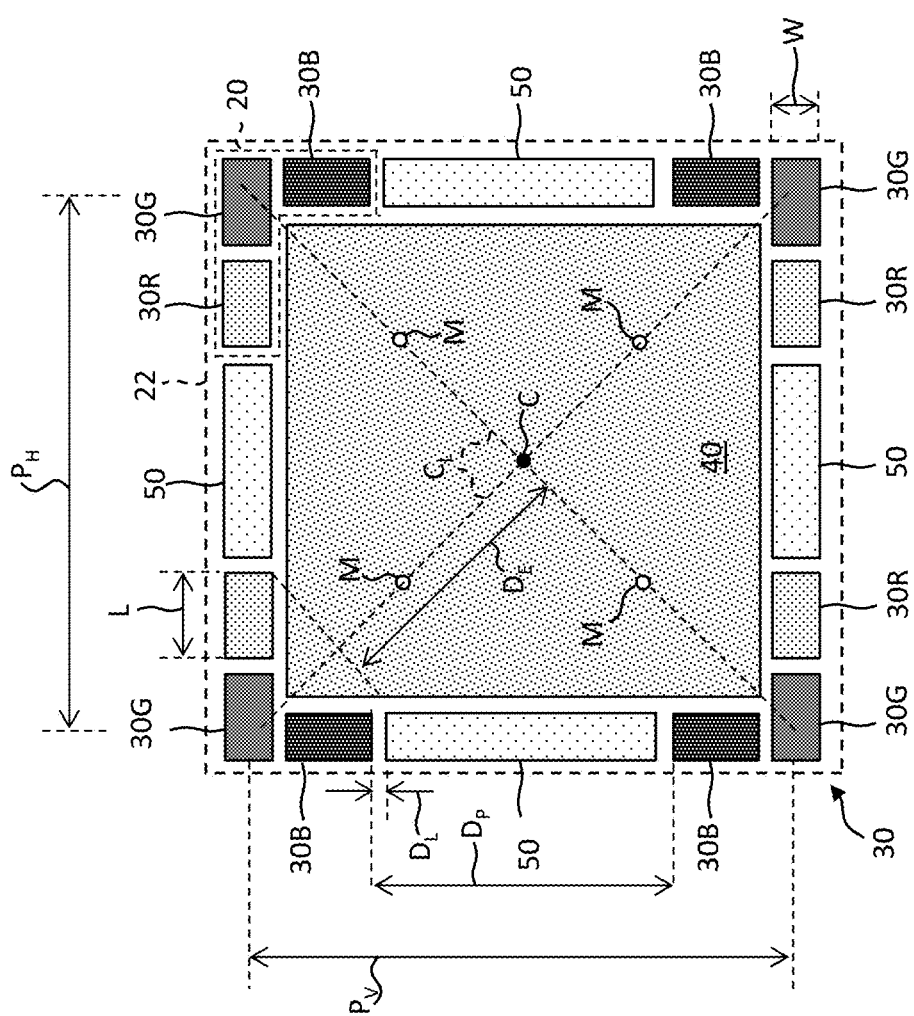
FIG. 5B is a detail schematic of the exemplary micro-light-emitting-diode display illustrated in FIG. 5A and according to illustrative embodiments of the present invention.
Figure 5D:
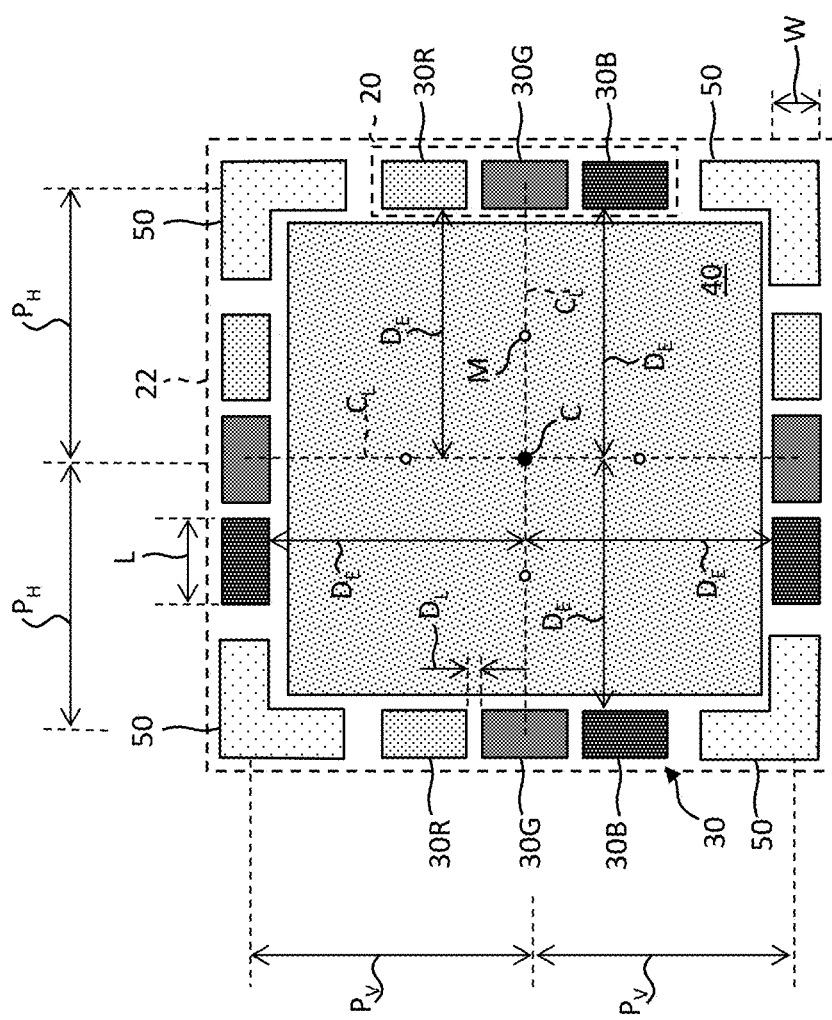
FIG. 5D is a detail schematic of the exemplary micro-light-emitting-diode display illustrated in FIG. 5C and according to illustrative embodiments of the present invention.

As with certain embodiments comprising pixel micro-controllers 40 having a non-unitary aspect ratio, in certain embodiments, the substantially rectangular shape or plus shape of FIGS. 5A and 5B comprises a first side opposing a second side in a first dimension (e.g., horizontal dimension H) and the two or more pixels 20 electrically connected to a pixel micro-controller 40 comprise a first pixel 20 and a second pixel 20. First pixel 20 can be closer to the first side than to a point M mid-way between a center C (or center line $C_L$) and the first side. Similarly, second pixel 20 can be closer to the second side than to a point M mid-way between a center C (or center line $C_L$) and the second side.

Furthermore, a substantially rectangular shape or plus shape can further comprise a third side opposing a fourth side in a second dimension orthogonal to the first dimension (e.g., a vertical dimension V) and two or more pixels 20 further comprise a third pixel 20 and a fourth pixel 20. The third pixel 20 can be closer to the third side than to a center C (or center line $C_L$), and the fourth pixel 20 can be closer to the fourth side than to the center C (or center line $C_L$). In certain embodiments, first, second, third, and fourth pixels 20 have an aspect ratio greater than one but, since first and second pixels 20 are rotated with respect to third and fourth pixels so that the distance between first and second pixels 20 is substantially the same as a distance between third and fourth pixels 20, horizontal pixel pitch $P_H$ is substantially equal to vertical pixel pitch $P_V$.

As with certain embodiments of the present invention comprising two pixels 20 in each pixel unit 22, in the embodiments of FIGS. 5A and 5B, a spatial separation between pixels 20 for each adjacent pair of pixels 20 in a pixel array is greater than a spatial separation between micro-light-emitting elements 30 in at least one pixel 20 in the pixel array in at least one dimension over the extent of a display substrate 10. Furthermore, the spatial separation between pixels 20 in a pixel unit 22 or between pixels 20 in adjacent pixel units 22 is greater than a size of each of the two or more micro-light-emitting elements 30 in at least one pixel 20 in the pixel array. All of the two or more micro-light-emitting elements 30 in each pixel 20 are disposed in a common pixel direction $P_D$ orthogonal to a center line $C_L$ of pixel micro-controller 40 an element distance $D_E$ substantially equal to or greater than one quarter of the extent of pixel micro-controller 40 in pixel direction $P_D$ from a center line $C_L$. Pixel direction $P_D$ for each pixel 20 controlled by a common pixel micro-controller 40 is different. As shown in FIGS. 5A and 5B, the pixel 20 on the left side of a pixel unit 22 has a pixel direction $P_D$ from a vertical center line $C_L$ that is horizontal to the left, the pixel 20 on the right side of the pixel unit 22 has a pixel direction $P_D$ from a vertical center line $C_L$ that is horizontal to the right, the pixel 20 on the top side of the pixel unit 22 has a pixel direction $P_D$ from a horizontal center line $C_L$ that is vertical and up (towards the top), and the pixel 20 on the bottom side of the pixel unit 22 has a pixel direction $P_D$ from a horizontal center line $C_L$ that is vertical and down (towards the bottom). The element distances $D_E$ for pixels 20 are substantially the same magnitude, but each has a different direction $P_D$.

Referring to FIG. 6A and the detail of FIG. 6B, a micro-light-emitting-diode display comprises pixels 20 in which independent micro-controllers 41 each control a single pixel 20 comprising a red micro-light-emitting element 30R, a green, micro-light-emitting element 30G, and a blue micro-light-emitting element 30B. Because the independent micro-controllers 41 control only three micro-light-emitting elements 30 in a single pixel 20, they each require less circuitry and area than pixel micro-controllers 40 of FIGS. 1A, 1B, 2A, and 2B, which each drive four micro-light-emitting elements 30 in two pixels 20, pixel micro-controllers 40 of FIGS. 3A, 3B, 4A, and 4B, which each drive six micro-light-emitting elements 30 in two pixels 20, or pixel micro-controllers 40 of FIGS. 5A and 5B, which each drive twelve micro-light-emitting elements 30 in four pixels 20.

According to some embodiments of the present invention, pixel micro-controllers 40 that each drive multiple pixels 20 each comprising multiple micro-light-emitting elements 30 have a reduced area compared to the combined area of multiple pixel micro-controllers 40 that each control a single pixel 20 or micro-light-emitting element 30. Thus, in certain embodiments, micro-light-emitting-diode displays 99 with greater pixel density and increased resolution together with smaller control circuits, reduced costs, and improved visual color integration are provided. A digital pixel micro-controller 40 has been designed, constructed, and put into use that increases in size by approximately 12% for each additional micro-light-emitting element 30 to be controlled by the digital pixel micro-controller 40.

Thus, in accordance with certain embodiments, pixel micro-controllers 40 in accordance with the exemplary embodiments illustrated in FIGS. 1A, 1B, 2A, 2B) that control two pixels 20 each having two micro-light-emitting elements 30 require approximately 40% less area than two micro-controllers 41 illustrated in FIGS. 6A and 6B that each control only a single pixel 20. Pixel micro-controllers 40 in accordance with the exemplary embodiments illustrated in FIGS. 3A, 3B, 4A, 4B that control two pixels 20 each having three micro-light-emitting elements 30 require approximately 33% less area than two micro-controllers 41. Pixel micro-controllers 40 in accordance with the exemplary embodiments illustrated in FIGS. 5A, 5B, 5C, 5D that control four pixels 20, each having three micro-light-emitting elements 30, require nearly 50% less area than four of the micro-controllers 41 illustrated in FIGS. 6A and 6B that each control only a single pixel 20. Because the illustrative embodiments of FIGS. 1A, 1B and FIGS. 2A, 2B include four micro-light-emitting elements 30, for clarity the illustrated area of pixel micro-controller 40 is increased by approximately 12% compared to micro-controllers 41 of FIGS. 6A and 6B that control three micro-light-emitting elements 30. Similarly, the illustrative embodiments of FIGS. 3A, 3B and FIGS. 4A, 4B include two pixels 20 with six micro-light-emitting elements 30 and, for clarity the illustrated area of pixel micro-controller 40 is increased by approximately 50% compared to micro-controllers 41 of FIGS. 6A, 6B. In the same way, pixel micro-controller 40 of FIGS. 5A and 5B are approximately increased by approximately 200% so as to illustrate the size increase for pixel micro-controllers 40 that control four pixels 20 and twelve micro-light-emitting elements 30.

Figure 7:
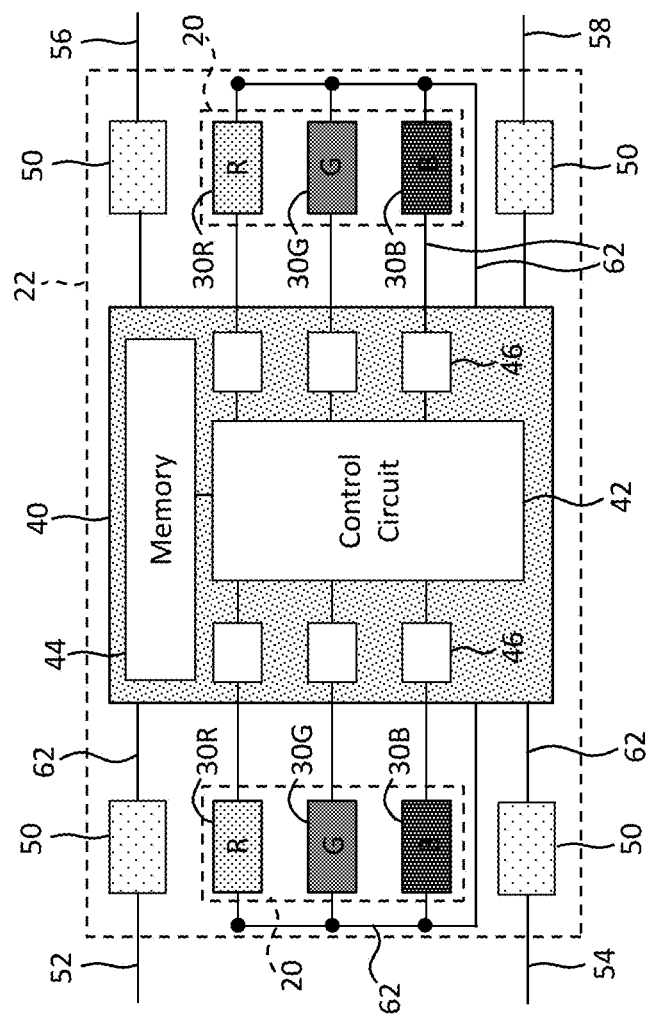
FIG. 7 is an electrical schematic illustrating an exemplary pixel unit in a configuration comprising pixels that each comprise three light-emitting elements and pixel micro-controllers that each control two pixels, according to illustrative embodiments of the present invention.

According to some embodiments of the present invention and referring to FIG. 7, a pixel micro-controller 40 can be provided in a digital integrated circuit with mixed-signal drive circuitry (driver 46) and digital control circuitry (control circuit 42, memory 44). A single control circuit 42 can be used to control all of the micro-light-emitting elements 30 electrically connected to the pixel micro-controller 40 (e.g., a red micro-light-emitting element 30R, a green micro-light-emitting element 30G, and a blue micro-light-emitting element 30B for each of two pixels 20). A memory 44 can store signals specifying the light output of each micro-light-emitting element 30. Each of power 56, ground 58, and control signals such as column data signals 52 and row control signals 54 for all of the micro-light-emitting elements 30 electrically connected in common with a pixel micro-controller 40 can be supplied through contact pads 50. Thus, the pixel micro-controller 40 comprises pixel portions that each exclusively controls a pixel 20 electrically connected to the pixel micro-controller 40 (e.g., drivers 46, and portions of the memory 44), and a shared portion that provides control in common to all pixels 20 electrically connected to the pixel micro-controller 40 (e.g., control circuit 42 and contact pads 50).

In certain embodiments, in operation, an external display controller 18 (e.g., as shown in FIG. 15A and including row controller 16 and column controller 14, discussed below) provides power 56, ground 58, column data signals 52, and row control signals 54 through wires 62 formed on a display substrate 10 to contact pads 50. Contact pads 50 are electrically connected to a pixel micro-controller 40. The pixel micro-controller 40 receives the signals and stores the column data information in a memory 44 using a control circuit 42. Once the column data information is stored, control circuit 42 provide signals to drivers 46 that drive the respective two or more micro-light-emitting elements 30 of each pixel 20. Each micro-light-emitting element 30 receives a current signal at a desired voltage from a respective driver 46 and is connected to a ground 58 line so that a voltage differential is provided across micro-light-emitting elements 30 and micro-light-emitting elements 30 emit light.

Figure 8:
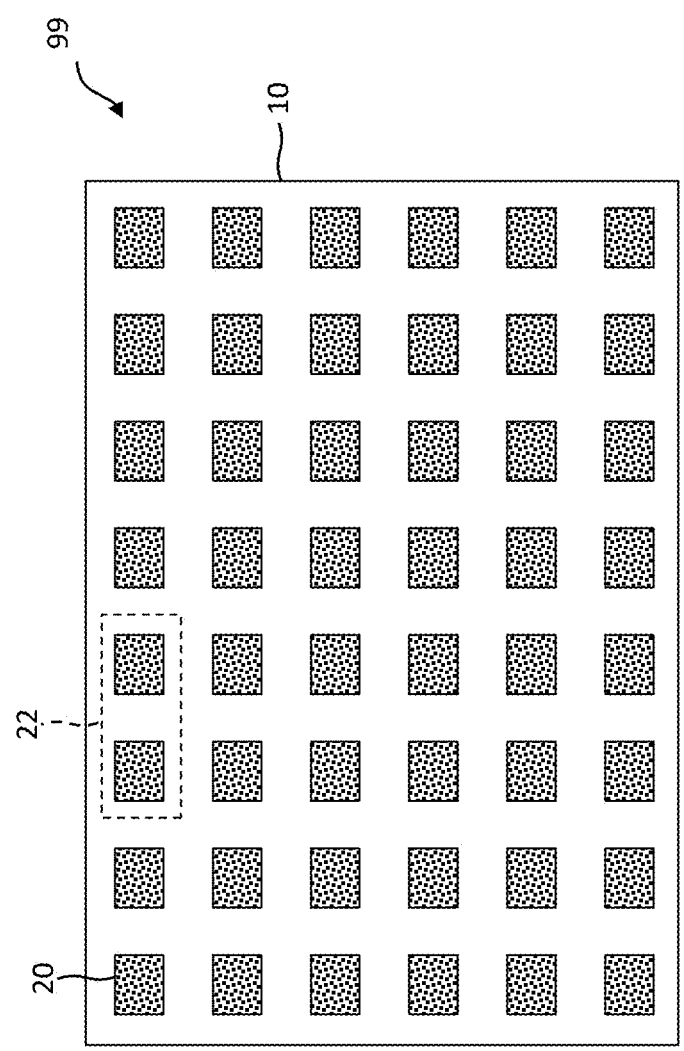
FIG. 8 is a schematic plan view illustrating an exemplary arrangement of pixels in a configuration comprising pixels arranged in aligned rows and aligned columns, according to illustrative embodiments of the present invention.

Certain embodiments of the present invention provide pixels 20 disposed on or over a display substrate 10 at various locations and in different configurations. Referring to FIG. 8, in some embodiments, pixels 20 are distributed in a strictly regular array with aligned rows and aligned columns of pixels 20 so that all of the rows are spaced a common distance from an edge of a display substrate 10 and all of the columns are spaced a common distance from another edge of the display substrate 10, for example an edge that is orthogonal to the edge from which the rows are commonly spaced. Such an arrangement is readily constructed in accordance with the embodiments illustrated in FIGS. 1A, 1B, 2A, 2B, 3A, 3B, 4A, 4B, and 5A, 5B.

Figure 9:
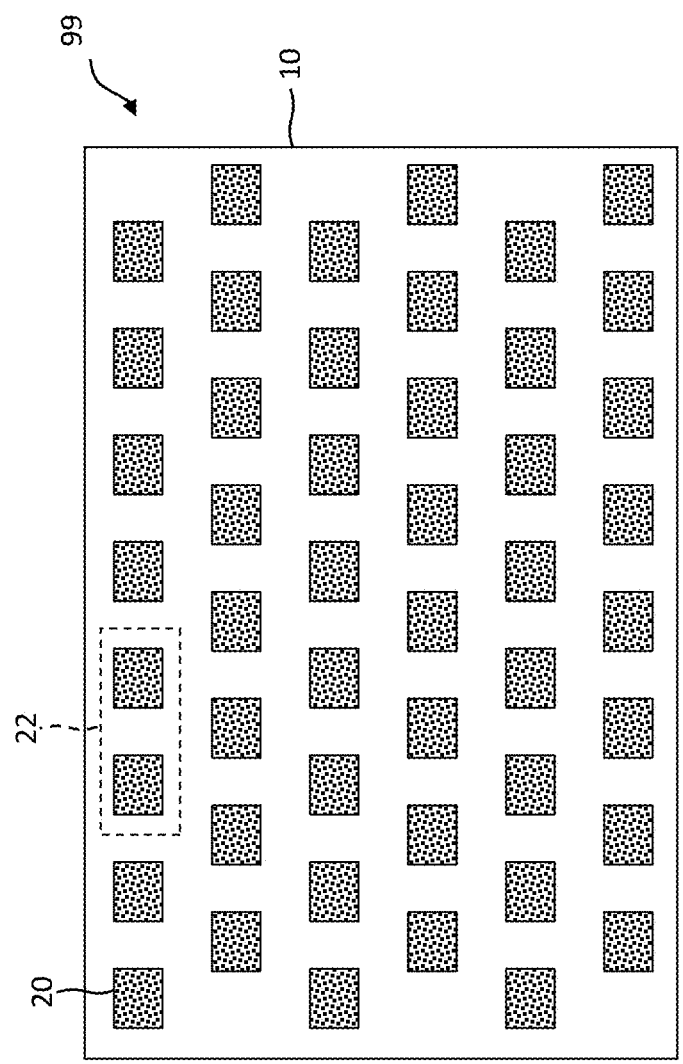
FIG. 9 is a schematic plan view illustrating an exemplary arrangement of pixels in a configuration comprising pixels arranged in alternating offset rows and aligned columns, according to illustrative embodiments of the present invention.
Figure 10:
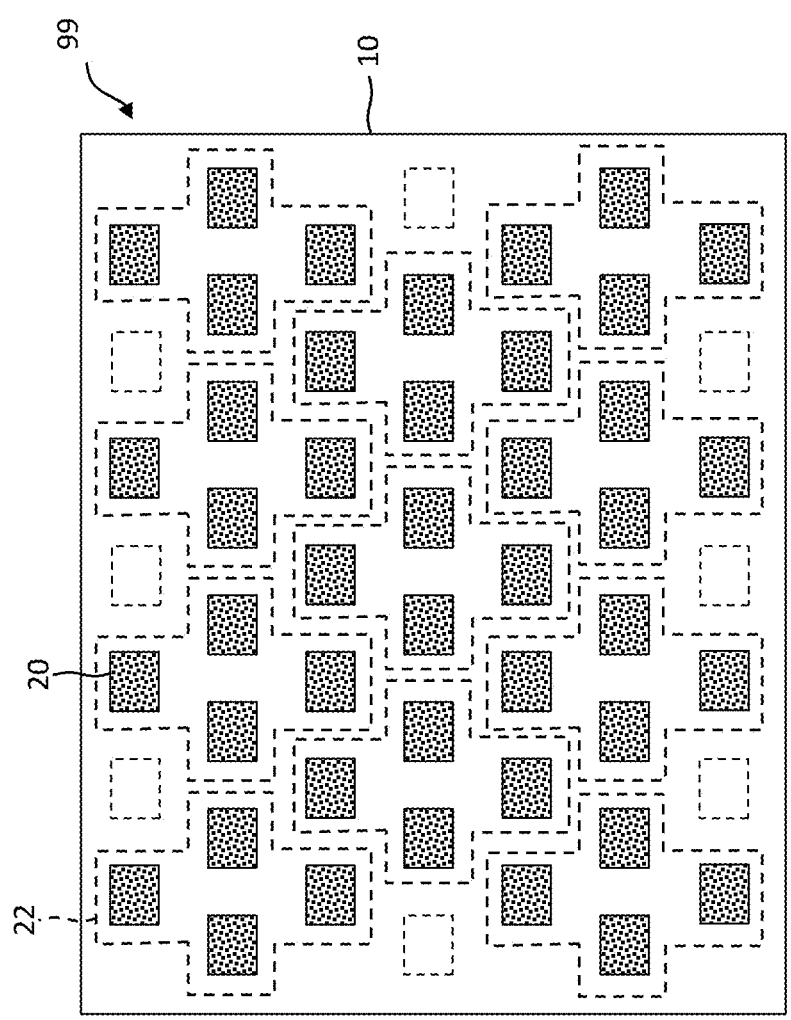
FIG. 10 is a schematic plan view corresponding to FIG. 9 with pixel units having a plus-shape indicated, according to illustrative embodiments of the present invention.

Referring to the exemplary embodiment shown in FIG. 9, pixels 20 in an array are disposed in rows and columns and alternating rows are offset in a row direction or alternating columns are offset in a column direction (not shown), or both, for example constructed in accordance with embodiments illustrated in FIGS. 1A, 1B, 2A, 2B, 3A, 3B, and 4A, 4B (e.g., having similar pixel units). FIG. 10 illustrates an exemplary embodiment comprising offset alternating rows using plus-shaped pixel micro-controllers 40 (e.g., as illustrated in FIG. 14F). The embodiments of FIGS. 5C and 5D can have alternating sets of three rows that are offset from adjacent sets of three rows. The center row of each set of three has twice the number of pixels 20. This arrangement, with suitable pixel processing, can provide increased display resolution.

Figure 11A:
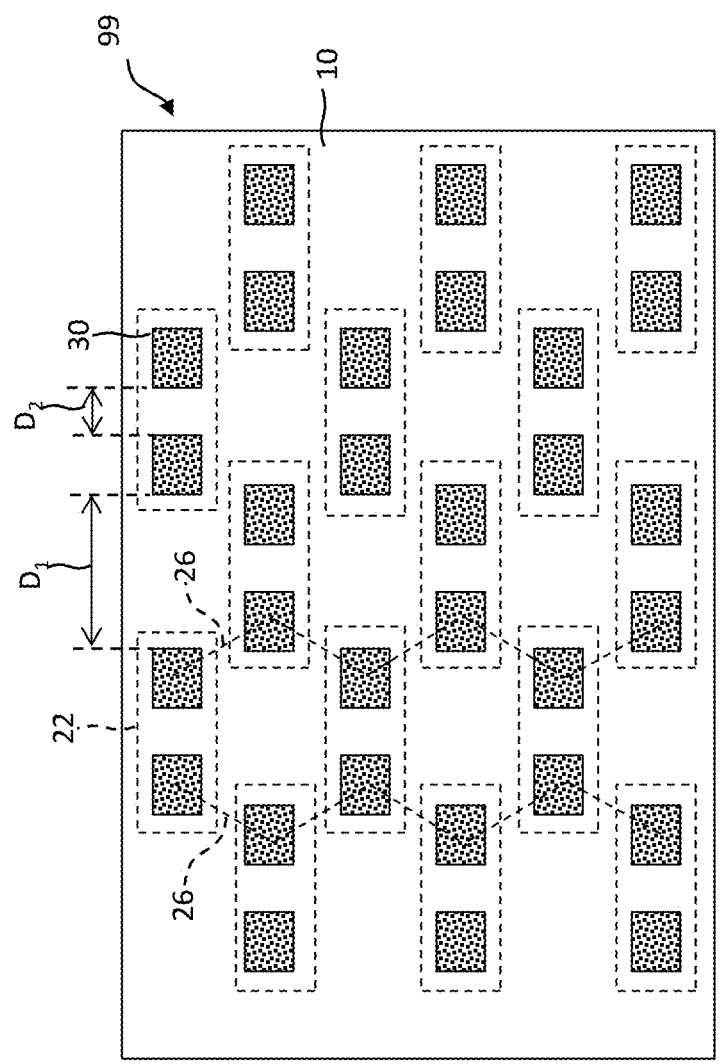
FIG. 11A is a schematic plan view illustrating an exemplary arrangement of pixels in a configuration comprising pixels arranged in alternating offset rows and aligned columns wherein adjacent columns are disposed in a mirrored zigzag pattern arrangement, according to illustrative embodiments of the present invention.
Figure 11B:
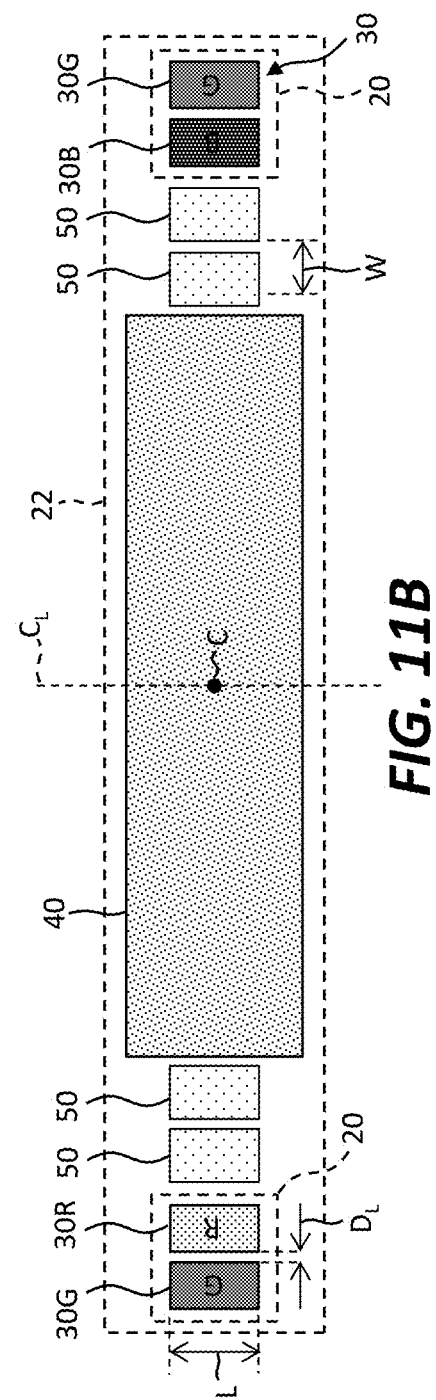
FIG. 11B is a detail schematic of the exemplary micro-light-emitting-diode display illustrated in FIG. 11A and according to illustrative embodiments of the present invention.

Referring to FIG. 11A and the detail of FIG. 11B, according to some embodiments of the present invention, pixel micro-controller 40 and micro-light-emitting elements 30 or pixels 20 in a pixel unit 22 are disposed in a line, for example a line that passes through each of pixel micro-controller 40 and micro-light-emitting elements 30 or a line that passes through the center C or centroid of pixel micro-controller 40 and micro-light-emitting elements 30 or pixels 20. In some embodiments, contact pads 50, centers of contact pads 50, or centroids of contact pads 50 are in a same line. Such an arrangement can have a greater aspect ratio with further separation and can also be used in a more-sparse pixel 20 arrangement on a display substrate 10, ultimately enabling a higher density. Pixels 20 can each comprise two or three micro-light-emitting elements 30, or more.

In some embodiments, contact pads 50 are disposed between a pixel micro-controller 40 and micro-light-emitting elements 30 or between a pixel micro-controller 40 and only some micro-light-emitting elements 30. In some embodiments, micro-light-emitting elements 30 are between contact pads 50 and a pixel micro-controller 40, so that contact pads 50 are at the ends of the pixel micro-controller 40.

In some embodiments, as shown in FIG. 11A, alternating pixels 20 in a dimension are spaced further apart, so that pixels 20 in a common pixel unit 22 are closer together than pixels 20 in different pixel units 22. In some such embodiments, pixels 20 in the pixel array are disposed in rows and columns, each column of pixels 20 forms a zigzag pattern 26, adjacent columns are mirror reflections of each other, and a distance $D_2$ between pixels 20 in a pixel unit 22 is less than a distance $D_1$ between pixels 20 in adjacent pixel units 22 in a same dimension. Adjacent pixel columns that are mirror reflections have pixels 20 that are alternately closer together and farther apart in each row in the columns. (The micro-light-emitting elements 30 in pixels 20 are not necessarily disposed in a mirrored arrangement but can have the same arrangement in every pixel 20, regardless of row or offset.)

Figure 18:
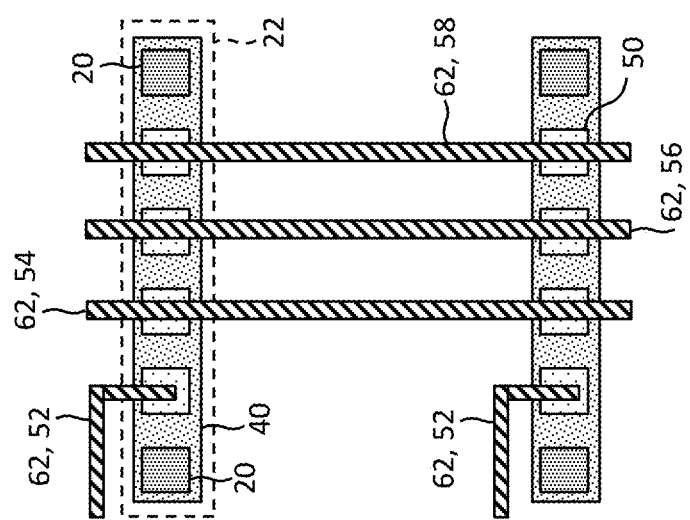
FIG. 18 is a schematic plan view illustrating an exemplary micro-light-emitting-diode display in a configuration comprising pixel units that each comprise two pixels and a pixel micro-controller with contact pads provided in a linear array on the pixel unit to facilitate electrical connections, according to illustrative embodiments of the present invention.

Disposing pixel units 22 over a display substrate 10 with a common orientation and contact pads 50 disposed in a line with pixel micro-controller 40 and micro-light-emitting elements 30 enables a straightforward arrangement of wires 62 that provide power 56, ground 58, and control signals (e.g., row control signals 54 and column data signals 52) on or over the display substrate 10 (e.g., as shown in FIG. 18). In FIG. 18, wires 62 carry power 56, ground 58, column data signals 52, and row control signals 54 to contact pads 50 and thence to a pixel micro-controller 40 that controls the pixels 20. Wires 62 can be arranged in a vertical parallel arrangement that reduces cross-overs on a display substrate 10.

Figure 11C:
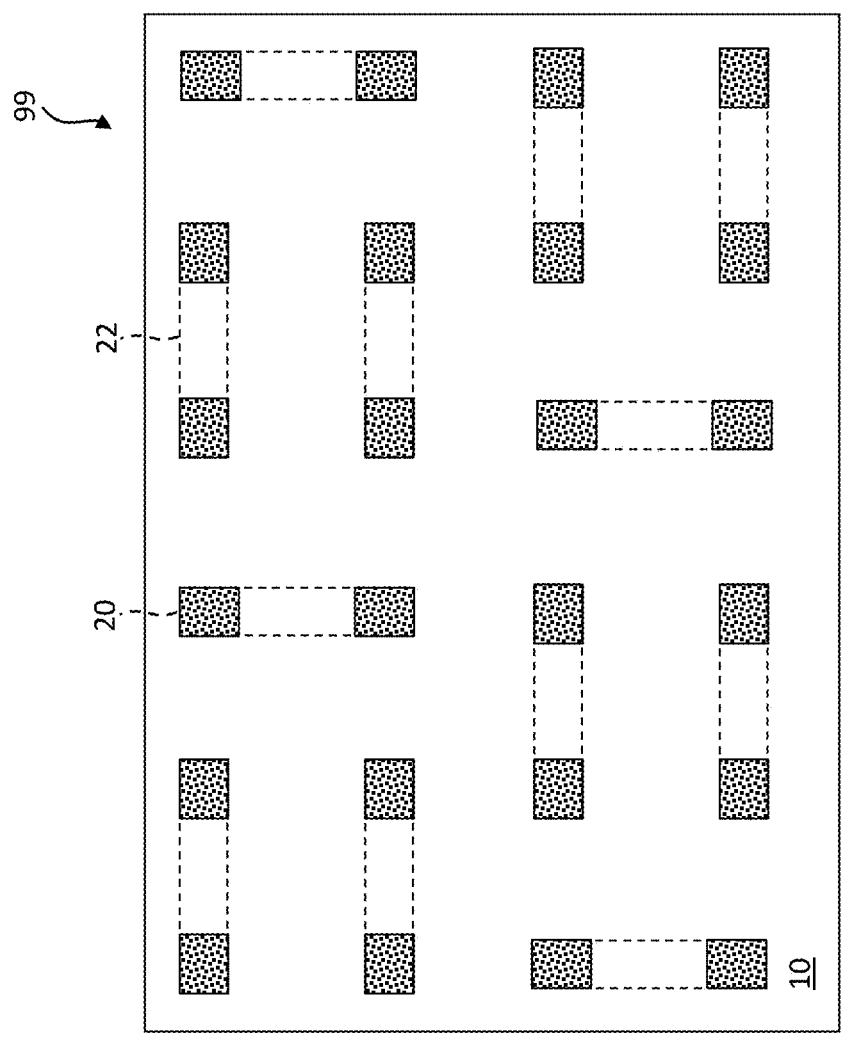
FIG. 11C is a schematic plan view illustrating an exemplary arrangement of pixels using the pixel unit configuration of FIG. 11B, according to illustrative embodiments of the present invention.

Referring to FIG. 11C, pixel units 22 can be arranged in different orientations over a display substrate 10.

Certain embodiments of the present invention can be constructed using micro-transfer printing. In such techniques, devices or components such as micro-inorganic light-emitting diodes or pixel micro-controllers 40 are formed on a native source substrate using photolithographic methods. The devices are then released from the native source substrate by removing a sacrificial portion from beneath each device or component, leaving the devices or components attached to anchor portions of the native source substrate with tethers. A stamp then contacts the devices, breaking or separating the tethers and adhering the devices to the stamp. The stamp is moved to a destination substrate and the devices with a broken or separated tether are contacted to the destination substrate, a layer on the destination substrate, or an adhesive layer disposed on the destination substrate. The devices with a broken or separated tether are adhered to the destination substrate, destination substrate layer, or destination substrate adhesive layer, and the stamp removed. Micro-transfer printing methods can be employed to make a variety of structures in a corresponding variety of embodiments.

Figure 12A:
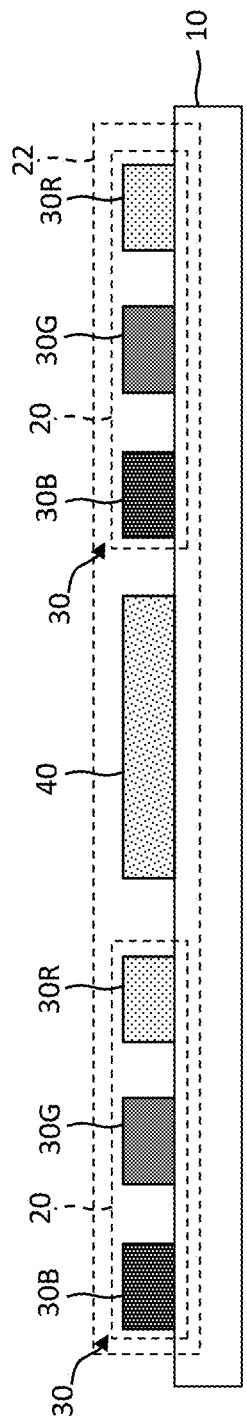
FIG. 12A is a schematic cross section illustrating an exemplary arrangement of pixels and a pixel micro-controller comprising micro-light-emitting elements and a pixel micro-controller disposed directly on a display substrate, according to illustrative embodiments of the present invention.
Figure 12B:
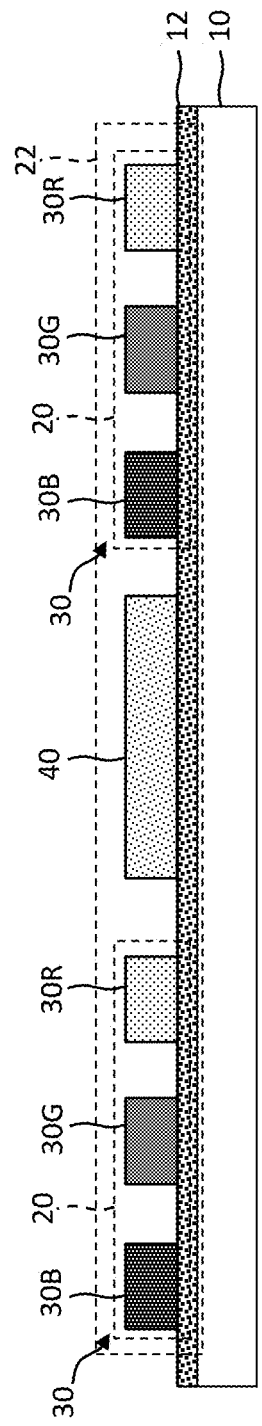
FIG. 12B is a schematic cross section illustrating an exemplary arrangement of pixels and a pixel micro-controller comprising micro-light-emitting elements and a pixel micro-controller adhered directly to a display substrate with an adhesive layer, according to illustrative embodiments of the present invention.
Figure 12C:
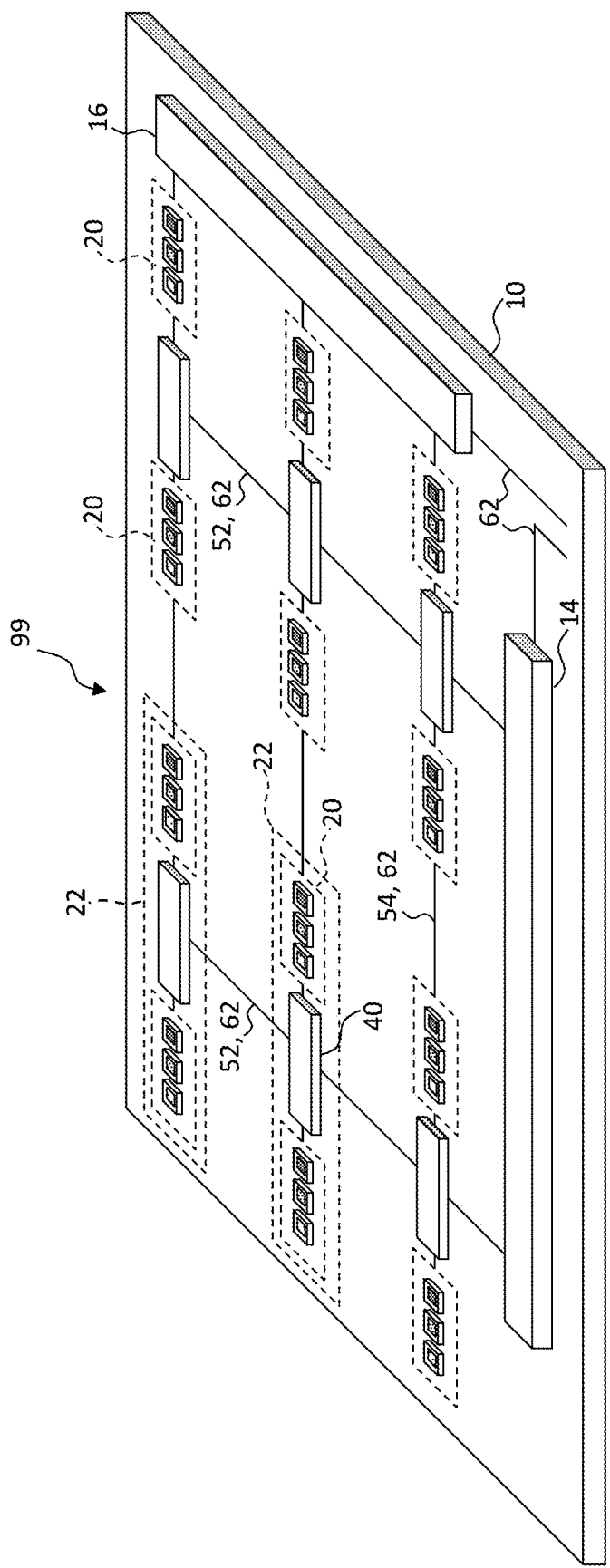
FIG. 12C is a schematic perspective illustrating an exemplary arrangement of pixels and a pixel micro-controller according to illustrative embodiments of the present invention in accordance with FIG. 12A.
Figure 13A:
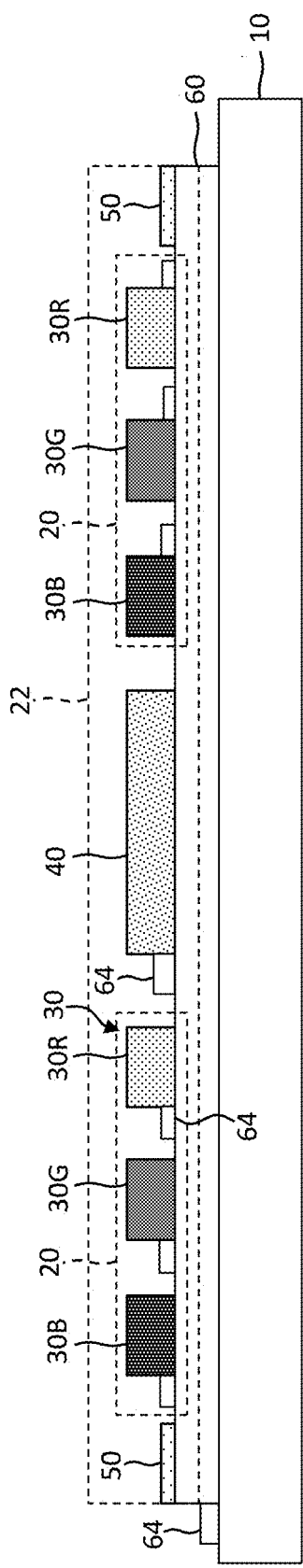
FIG. 13A is a schematic cross section illustrating an exemplary arrangement of pixels and a pixel micro-controller comprising micro-light-emitting elements and the pixel micro-controller disposed directly on a pixel substrate, the pixel substrate disposed directly on a display substrate, according to illustrative embodiments of the present invention.
Figure 13B:
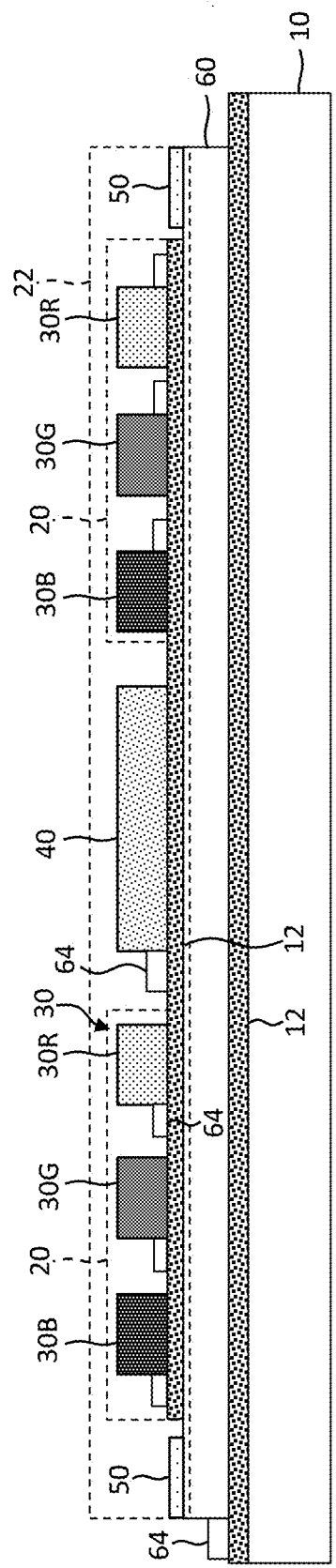
FIG. 13B is a schematic cross section illustrating an exemplary arrangement of pixels and a pixel micro-controller comprising micro-light-emitting elements and the pixel micro-controller adhered directly to a pixel substrate with an adhesive layer, the pixel substrate adhered directly to a display substrate with an adhesive layer, according to illustrative embodiments of the present invention.

Referring to FIG. 12A and according to illustrative methods in accordance with certain embodiments of the present invention, each pixel micro-controller 40 and the two or more micro-light-emitting elements 30 of each of pixels 20 controlled by the pixel micro-controller 40 are disposed directly on or adhered directly to a display substrate 10 or a layer formed on the display substrate 10, for example an adhesive layer. Referring to FIG. 12B, an adhesive layer 12 is disposed on a display substrate 10 or layer formed on the display substrate 10 to facilitate adhesion between the display substrate 10 and pixel micro-controllers 40 and between the display substrate 10 and the two or more micro-light-emitting elements 30 of each pixel 20. Adhesive layer 12 can be a curable layer that is cured after the pixel micro-controllers 40 and the two or more micro-light-emitting elements 30 of each pixel 20 are disposed on (e.g., micro-transfer printed to) adhesive layer 12. The display substrate 10, pixel micro-controllers 40, and the two or more micro-light-emitting elements 30 of each pixel 20 can then be photolithographically processed to provide wires 62 (e.g., as shown in FIG. 12C) to electrically connect pixel units 22 to a row controller 16 and column controller 14, for example through contact pads 50. Any combination of pixel micro-controllers 40 and micro-light-emitting elements 30 can each have a broken or separated tether (e.g., as shown in FIGS. 13A and 13B). Thus, pixel micro-controllers 40 and inorganic micro-light-emitting elements 30 can be independent structures that are individually mounted on a display substrate 10, for example by micro-transfer printing the independent structures onto the display substrate 10.

Figure 13C:
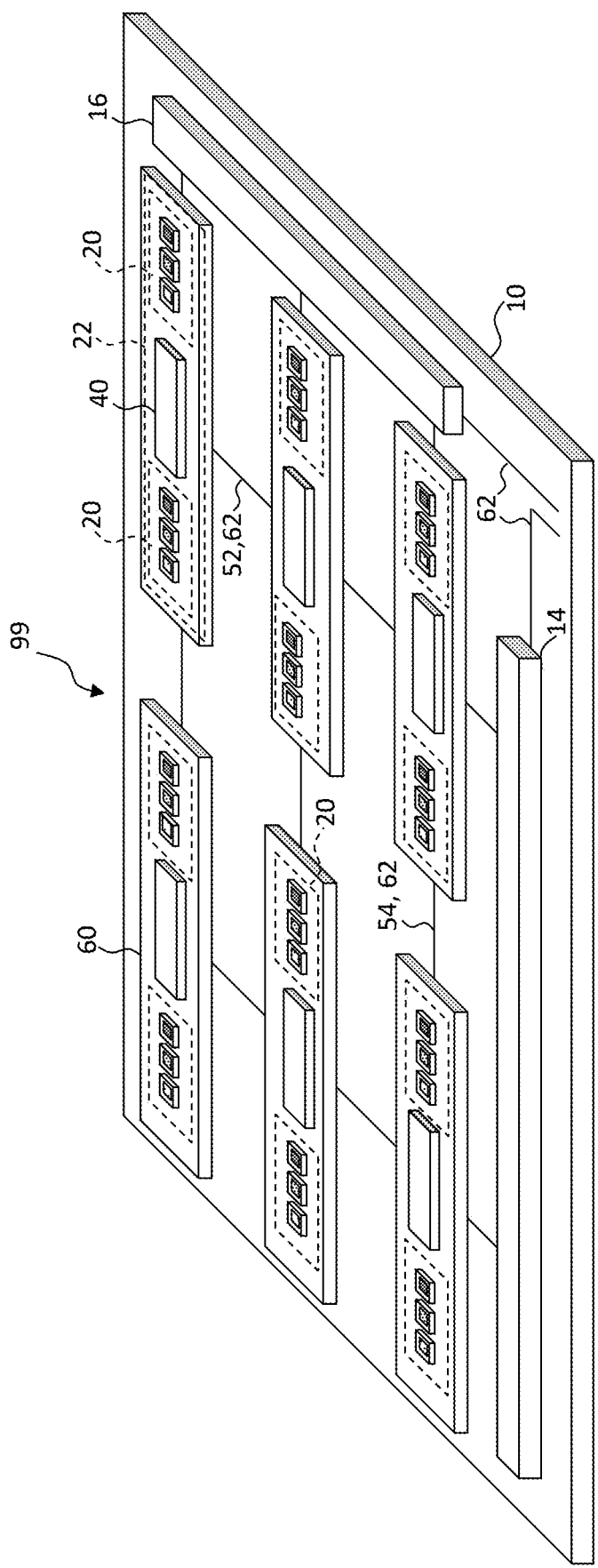
FIG. 13C is a schematic perspective illustrating an exemplary arrangement of pixels and a pixel micro-controller according to illustrative embodiments of the present invention in accordance with FIG. 13A.

In some embodiments of the present invention, and referring to FIGS. 13A, 13B, and 13C, a micro-light-emitting-diode display 99 comprises pixel substrates 60 arranged in an array on a display substrate 10. According to some embodiments of the present invention, a pixel substrate 60 can be any substrate capable of supporting pixels 20 and pixel micro-controllers 40, for example glass, plastic, ceramic, sapphire, quartz, or a semiconductor, such as a silicon wafer, and is separate, distinct, and independent of a display substrate 10 or any micro-light-emitting element 30 substrate. A pixel substrate 60 can comprise or be the same material as is used in a display substrate 10 and, independently, can be rigid or flexible. In certain embodiments, a pixel substrate 60 has a substantially planar surface with a much smaller thickness. For example, a pixel substrate 60 can have an area of 10 cm$^2$ or less and thicknesses in the range of 1 mm to 0.01 mm, or less.

For each pixel 20, the two or more micro-light-emitting elements 30 and pixel micro-controller 40 electrically connected to control pixel 20 are disposed directly on or adhered directly to a pixel substrate 60 or a layer formed on pixel substrate 60, for example by micro-transfer printing from one or more source substrates or wafers to the pixel substrates 60. In some embodiments, an adhesive layer 12 adheres the two or more micro-light-emitting elements 30 of each pixel 20 and a pixel micro-controller 40 to a pixel substrate 60. Pixel substrates 60 can themselves be prepared on a source wafer or substrate, for example silicon or glass, with micro-light-emitting elements 30 electrically connected by wires 62 to pixel micro-controller 40 in a pixel unit 22 and then micro-transfer printed to a display substrate 10. Thus, pixel substrates 60 can comprise a broken or separated tether 64 as well as pixel micro-controller 40 and micro-light-emitting elements 30 (e.g., as shown in FIGS. 13A and 13B). Thus, pixel micro-controllers 40 and the two or more micro-light-emitting elements 30 of each pixel 20 can be disposed directly on or adhered directly to a pixel substrate 60 or adhered to an adhesive layer 12 disposed on the pixel substrate 60. Likewise, pixel substrate 60 can be disposed directly on or adhered directly to a display substrate 10 or adhered to an adhesive layer 12 disposed on a display substrate 10. Hence, pixel micro-controllers 40 and inorganic micro-light-emitting elements 30 can be independent structures that are individually mounted on a pixel substrate 60, for example by micro-transfer printing the independent structures onto the pixel substrate 60.

Figure 14C:
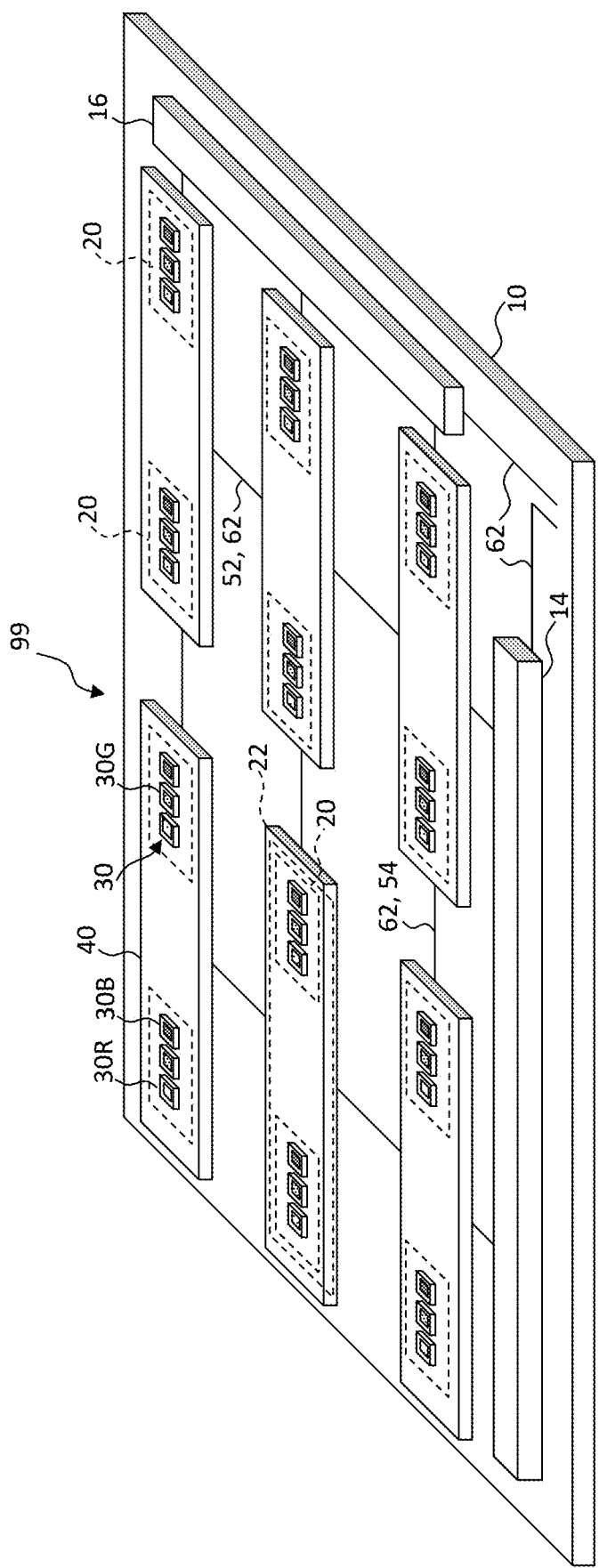
FIG. 14C is a schematic perspective illustrating an exemplary arrangement of pixels and a pixel micro-controller according to illustrative embodiments of the present invention in accordance with FIG. 14A.
Figure 14D:
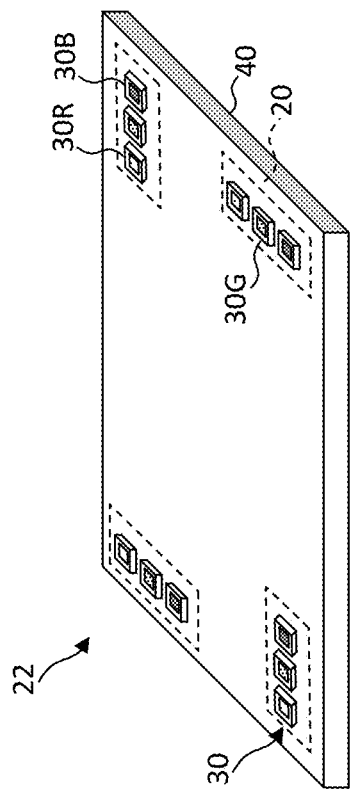
FIGS. 14D, 14E, and 14F are schematic perspectives corresponding to either of the embodiments of FIGS. 14A and 14B illustrating exemplary arrangements of pixels according to illustrative embodiments of the present invention, where
Figure 14E:
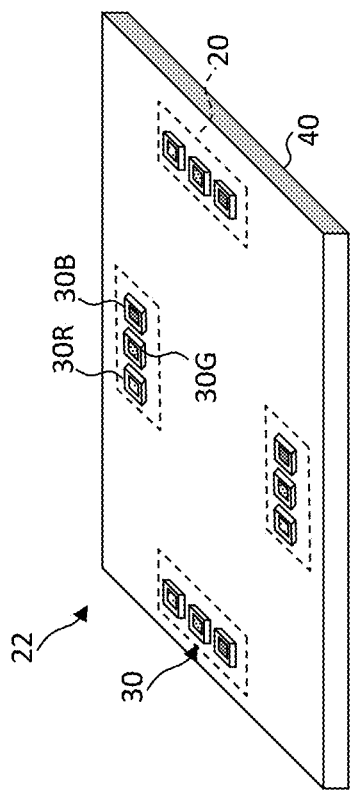
Figure 14F:
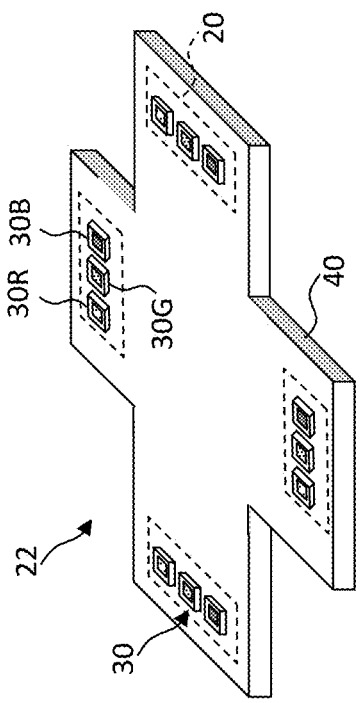

In some embodiments of the present invention, with reference to FIGS. 14A, 14B, and 14C, a micro-light-emitting-diode display 99 comprises two or more micro-light-emitting elements 30 of each pixel 20 disposed directly on (FIG. 14A) or adhered directly to pixel micro-controller 40 (FIG. 14B) or are disposed directly on or adhered directly to a layer formed on pixel micro-controller 40. In particular, in some embodiments, an adhesive layer 12 adheres two or more micro-light-emitting elements 30 of each pixel 20 to a pixel micro-controller 40. As illustrated in FIGS. 14D, 14E, and 14F, pixels 20 and micro-light-emitting elements 30 can be disposed in various locations on or over a pixel micro-controller 40. FIG. 14D shows pixels 20 disposed near edges of a rectangular pixel micro-controller 40, FIG. 14E shows pixels 20 near corners of a rectangular pixel micro-controller 40, and FIG. 14F shows pixels 20 near edges of a plus-shaped pixel micro-controller 40. In particular, plus-shaped pixel micro-controllers 40 can closely tile a display substrate 10, increasing display resolution and reducing native source wafer costs by reducing waste.

As illustrated in the Figures, arrangements of pixels 20 comprising micro-light-emitting elements 30 electrically connected to and controlled by pixel micro-controllers 40 comprising pixel units 22 can be disposed in a variety of configurations over display substrate 10. According to some embodiments of the present invention, any combination of pixel micro-controllers 40, pixel units 22, pixels 20, and micro-light-emitting elements 30 can have a non-unitary aspect ratio and a length greater than a width over a display substrate 10. Furthermore, the orientation of any pixel micro-controllers 40, pixel units 22, pixels 20, and micro-light-emitting elements 30 with respect to any other pixel micro-controllers 40, pixel units 22, pixels 20, and micro-light-emitting elements 30 can be different. Thus, in some embodiments of the present invention, some of pixels 20 can be rotated with respect to others of pixels 20 over or on a display substrate 10, either within a pixel unit 22 (for example as shown in FIGS. 5A-5D, 14D, and 14E) or between pixel units 22 (for example as additionally shown in FIG. 11C). In some embodiments of the present invention, at least some of the micro-light-emitting elements 30 in a pixel 20 are rotated with respect to other micro-light-emitting elements 30 in the same pixel 20 (for example as shown in FIGS. 5A-5D) over a display substrate 10. In some embodiments of the present invention, at least some micro-light-emitting elements 30 in pixels 20 are rotated with respect to a pixel micro-controller 40 (for example as shown in FIGS. 2A-2B, 4A-4B, and 11B) over the display substrate 10. Two or more devices or components are rotated when the longest dimensions of the devices or components are not aligned in the same direction.

In some embodiments of the present invention, micro-light-emitting elements 30 within a pixel 20 are disposed in a line over a display substrate 10 (for example as shown in FIGS. 1A-4D and FIGS. 11A-14F). In some other embodiments, micro-light-emitting elements 30 within a pixel 20 are not disposed in a line over a display substrate 10. Referring to FIG. 15A and the detail of FIG. 15B, micro-light-emitting elements 30 within a pixel 20 are disposed at the corners of a triangle over a display substrate 10 (also as shown in FIGS. 5A-5B). Contact pads 50 are disposed adjacent to the sides of a pixel micro-controller 40 (as in FIG. 5B) and electrical interconnections in a pixel unit 22 circuit are shown with wires 62. Each contact pad 50 is electrically connected to one of power 56, ground 58, row control signals 54, and column data signals 52 distributed on wires 62 on a display substrate 10 from a display controller 18, column controller 14, and row controller 16. (In some embodiments, column controller 14 and row controller 16 can be considered as a part of a larger display controller 18.) Contact pads 50 are electrically connected to pixel micro-controller 40 with wires 62 and micro-light-emitting elements 30 (e.g., red micro-light-emitting element 30R, green micro-light-emitting element 30G, and blue micro-light-emitting element 30B for each pixel 20 in a pixel unit 22).

Figure 17A:
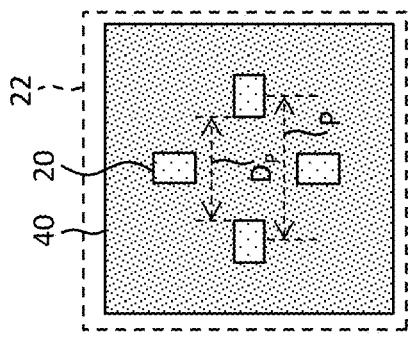
FIGS. 17A-17D illustrate different pixel layouts in two dimensions on a pixel micro-controller, according to illustrative embodiments of the present invention.
Figure 17B:
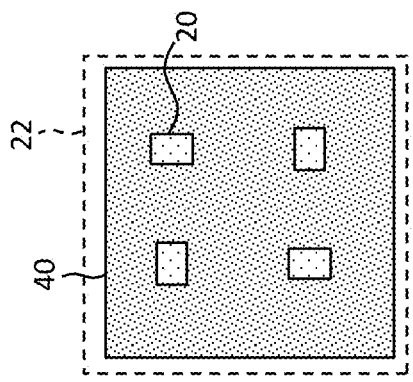
Figure 17C:
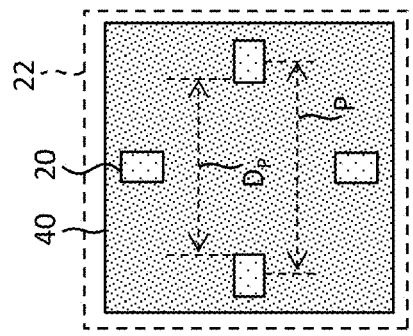
Figure 17D:
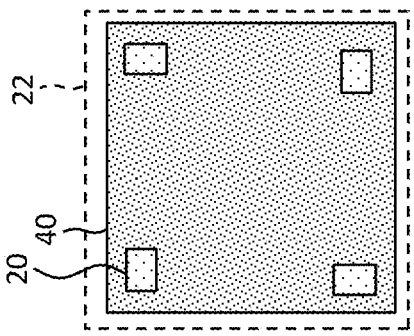

According to some embodiments of the present invention, in pixel units 22 that comprise a substantially rectangular pixel micro-controller 40 with a center and a length greater than a width over the extent of the display substrate 10, each pixel 20 in a pixel unit 22 is disposed closer to an edge of a pixel micro-controller 40 that controls the pixel 20 than a mid-point M between the edge and a center C of the pixel micro-controller 40 or even on a side of the edge opposite the mid-point M or center C. In some such arrangements, pixel separation and color integration are increased, for example, as shown in FIG. 16A (for two pixels 20 in a pixel unit 22) and FIGS. 17A, 17C (for four pixels 20 in a pixel unit 22) for any of the configurations shown in FIGS. 12A-14E. In some embodiments of the present invention, each pixel 20 in a pixel unit 22 is disposed closer to a mid-point M between the edge and a center C of the pixel micro-controller 40, as shown in FIG. 16B (for two pixels 20 in a pixel unit 22) and FIGS. 17B, 17D (for four pixels 20 in a pixel unit 22) for any of the configurations shown in FIGS. 12A-14E. This arrangement has the effect of reducing the pixel spacing and pixel pitch P and increasing the resolution. The arrangement of FIG. 16B is particularly useful for pixel 20 configurations such as those shown in FIG. 11A and, in two dimensions, the arrangements of FIGS. 17B and 17D.

In some embodiments of the present invention, each micro-light-emitting element 30 of two or more micro-light-emitting elements 30 in at least one pixel 20 is an inorganic micro-light-emitting diode, for example all micro-light-emitting elements 30 in a micro-light-emitting diode display 99 are inorganic micro-light-emitting diodes. In some embodiments of the present invention, each micro-light-emitting element 30 of two or more micro-light-emitting elements 30 in at least one pixel 20 is an organic light-emitting diode, for example all micro-light-emitting elements 30 in a micro-light-emitting diode display 99 are organic micro-light-emitting diodes. In some embodiments of the present invention, at least one of the micro-light-emitting elements 30 of two or more micro-light-emitting elements 30 in at least one pixel 20 is an inorganic micro-light-emitting diode and at least one micro-light-emitting element 30 of two or more micro-light-emitting elements 30 in a pixel 20 or another pixel 20 commonly controlled by a pixel micro-controller 40 is an organic micro-light-emitting diode. Thus, a micro-light-emitting-diode display 99 in accordance with certain embodiments of the present invention can include both organic and inorganic micro-light-emitting diodes in any combination. For example, pixels 20 can each comprise three micro-light-emitting elements 30, a micro-light-emitting element 30 that is a red organic micro-light-emitting diode that emits red light, a micro-light-emitting element 30 that is a green organic micro-light-emitting diode that emits green light, and a micro-light-emitting element 30 that is a blue inorganic micro-light-emitting diode that emits blue light.

In some embodiments, each pixel micro-controller 40 controls two or more pixels 20 comprising a first pixel 20 and a second pixel 20. In some embodiments, a first pixel 20 comprises a red organic micro-light-emitting diode that emits red light and a green organic micro-light-emitting diode that emits green light and a second pixel 20 comprises a blue inorganic micro-light-emitting diode that emits blue light and a green organic micro-light-emitting diode that emits green light. In some embodiments, the first pixel 20 comprises only two micro-light-emitting elements 30: the red organic micro-light-emitting diode and the green organic micro-light-emitting diode. In some embodiments, the second pixel 20 comprises only two micro-light-emitting elements 30: the green organic micro-light-emitting diode and the blue inorganic micro-light-emitting diode. In some embodiments, the first pixel 20 comprises only two micro-light-emitting elements 30, the red organic micro-light-emitting diode and the green organic micro-light-emitting diode, and the second pixel 20 comprises only two micro-light-emitting elements 30, the green organic micro-light-emitting diode and the blue inorganic micro-light-emitting diode.

According to some embodiments of the present invention, micro-light-emitting elements 30 can emit light in a direction away from a display substrate 10 (a top emitter) and the display substrate 10 can be substantially opaque (for example less than 50%, 30%, 20%, or 10% transparent to visible light) or substantially transparent (for example greater than 50%, 70%, 80%, or 90% transparent to visible light). In some embodiments of the present invention, micro-light-emitting elements 30 can emit light in a direction toward a display substrate 10 (a bottom emitter) and the display substrate 10 can be substantially transparent (for example greater than 50%, 70%, 80%, 90%, or 95% transparent to visible light). Likewise, any pixel substrate 60 can be substantially opaque (for example less than 50%, 30%, 20%, or 10% transparent to visible light) or substantially transparent (for example greater than 50%, 70%, 80%, 90%, or 95% transparent to visible light). If visible light is emitted through a pixel substrate 60 from micro-light-emitting elements 30, pixel substrates 60 are preferably substantially transparent (for example greater than 50%, 70%, 80%, 90%, or 95% transparent to visible light). A display substrate 10 and pixel substrates 60 can be either flexible or rigid.

In some embodiments of the present invention, a micro-light-emitting-diode display 99 is a substantially single-layer display in which wires 62 (e.g., row control signals 54, column data signals 52, power 56, and ground 58 wires 62) are disposed substantially in a single layer in, on, or over a display substrate 10 and pixel units 22 are also disposed in, on, or over display substrate 10, for example in or on the same single layer. Where any of wires 62 intersect on, in, or over display substrate 10, a jumper wire or via connection can be provided but these jumper wires or connections represent only a small fraction of the area of display substrate 10, so that wires 62 are substantially disposed in a single layer, for example a single patterned layer of metal lines that provide electrical connections to pixel units 22. By providing wires 62 in a single layer on, in, or over a display substrate 10, manufacturing costs and materials for a micro-light-emitting-diode display 99 can be substantially reduced (e.g., due to a reduced number of photolithographic processing steps).

Certain embodiments of the present invention provide improved image display architectures for displays (for example light-emitting diode displays) having improved resolution, fewer or smaller micro-integrated circuits with reduced material costs, higher yields with reduced manufacturing costs, and improved visual quality.

Referring again to FIGS. 12C, 13C, 14C, and 15A, a column controller 14 is electrically connected to each column data signal 52 wire 62 and is disposed on a display substrate 10. In some embodiments of the present invention, a column controller 14 for all of the column data signal 52 wires 62 can be a single integrated circuit, for example having a single column-controller substrate separate, distinct, and independent from a display substrate 10, from pixel micro-controller 40 substrates, from pixel substrates 60, and from micro-light-emitting element 30 substrates in pixels 20. In some embodiments of the present invention, a column controller 14 comprises a plurality of column-controller integrated circuits, each electrically connected to one or more column data signal 52 wires 62, and each having a column-controller substrate separate, distinct, and independent from a display substrate 10, from micro-light-emitting element 30 substrates in pixels 20, and from any other column-driver integrated circuit.

Referring still to FIGS. 12C, 13C, 14C, and 15A, similarly, a row controller 16 is electrically connected to each row control signal 54 wire 62 and is disposed on a display substrate 10. In some embodiments of the present invention, a row controller 16 for all of the row control signal 54 wires 62 can be a single integrated circuit, for example having a single row-controller substrate separate, distinct, and independent from a display substrate 10, from pixel micro-controller 40 substrates, from pixel substrates 60, and from micro-light-emitting element 30 substrates in pixels 20. In some embodiments of the present invention, a row controller 16 comprises a plurality of row-controller integrated circuits, each electrically connected to one or more row control signal 54 wires 62, and each having a row-controller substrate separate, distinct, and independent from a display substrate 10, from pixel substrates 60, from micro-light-emitting element 30 substrates in pixels 20, and from any other column-driver integrated circuit.

According to some embodiments of the present invention, pixel micro-controllers 40 in pixel units 22 are electrically connected to and control two or more micro-light-emitting elements 30 in two or more pixels 20. The information for driving micro-light-emitting elements 30 of two or more pixels 20 can be transmitted through a single contact pad 50 connected to a single column data signal 52 wire 62. Similarly, row control signals 54 can be transmitted through a single contact pad 50 connected to a single row control signal 54 wire 62. Thus, a single column data signal 52 wire 62 can provide information for multiple pixels 20 or for multiple micro-light-emitting elements 30 in one or more columns of pixels 20 and a single row control signal 54 wire 62 can provide control for multiple pixels 20 or for multiple micro-light-emitting elements 30 in one or more rows of pixels 20. Thus, according to some embodiments of the present invention, a micro-light-emitting-diode display 99 can have fewer column data signal 52 wires 62 than columns of pixels 20 or columns of micro-light-emitting elements 30. Likewise, a micro-light-emitting-diode display 99 can have fewer row control signal 54 wires 62 than rows of pixels 20 or rows of micro-light-emitting elements 30. In some embodiments, there are fewer column data signal 52 wires 62 than columns of pixels 20 or columns of micro-light-emitting elements 30 and fewer row control signal 54 wires 62 than rows of pixels 20 or rows of micro-light-emitting elements 30, for example as shown in FIG. 15A.

In some embodiments of an active-matrix micro-light-emitting-diode display 99, a pixel micro-controller 40 is a micro-integrated circuit, for example comprising a controller substrate separate, distinct, and independent of any micro-light-emitting element 30 substrates and display substrate 10, made using photolithographic methods and materials found in the integrated circuit industry. Column data signal 52 wires 62 and row control signal 54 wires 62 (and power 56 and ground 58 wires 62) are electrically conductive wires, e.g., traces, for conducting electrical power and signals to pixel units 22 and can be made, for example, using photolithographic, screen printing, or printed-circuit board materials and methods on or in the display substrate 10.

Inorganic micro-light-emitting diodes can comprise a semiconductor diode substrate, for example a compound semiconductor such as GaN, InGaN, GaAs, or other compound semiconductors useful for inorganic micro-light-emitting diodes made using photolithographic processes and materials.

In some embodiments of the present invention, each inorganic micro-light-emitting diode has at least one (e.g., any combination) of (i) a width from 2 to 100 µm (e.g., 2 to no more than 5 µm, 5 to no more than 10 µm, 10 to no more than 20 µm, 20 to no more than 50 µm, or 50 to no more than 100 µm), (ii) a length from 2 to 250 µm (e.g., 2 to no more than 5 µm, 5 to no more than 10 µm, 10 to no more than 20 µm, 20 to no more than 50 µm, 50 to no more than 100 µm, or 100 to no more than 250 µm), and (iii) a thickness from 2 to 50 µm (e.g., 2 to no more than 5 µm, 5 to no more than 10 µm, 10 to no more than 20 µm, or 20 to no more than 50 µm). U.S. Pat. No. 6,825,559 describes methods of making micro-transfer-printable inorganic micro-light-emitting diode, the disclosure of which are hereby incorporated by reference.

Any combination of micro-light-emitting elements 30, inorganic or organic micro-light-emitting diodes, row controllers 16, column controllers 14, pixel micro-controllers 40, or pixel substrates 60 can be micro-devices micro-transfer printed from a native source wafer to a display substrate 10, another substrate, or to a substrate disposed on the display substrate 10 such as a pixel substrate 60. Any organic or inorganic micro-light-emitting diodes, micro-light-emitting elements 30, row controllers 16, column controllers 14, pixel micro-controllers 40, or pixel substrates 60 can comprise a broken (e.g., fractured) or separated tether 64 as a consequence of the micro-transfer printing process.

Furthermore, in some embodiments of the present invention, a pixel substrate 60 is micro-transfer printed from a pixel source wafer onto a display substrate 10 and a pixel substrate 60 comprises a broken (e.g., fractured) or separated pixel tether 64. A pixel substrate 60 can have at least one of (i) an area of 10 to no more than 1 square mm (e.g., 10 to no more than 50 square microns, 50 to no more than 100 square microns, 100 to no more than 500 square microns, or 500 square microns to no more than 1 square mm) and (ii) a thickness of 1 to no more than 50 microns (e.g., 1 to no more than 5 microns, 5 to no more than 10 microns, 10 to no more than 20 microns, or 20 to no more than 50 microns). Such small pixel substrates 60 can be more readily micro-transfer printed and constructed using high-resolution photolithographic techniques. Thus, pixel-substrate wires 62 or other electrical conductors disposed on the pixel substrates 60 can be formed using, for example, photolithographic methods and materials and have a small width, can be disposed closer together, and can have a higher resolution than wires 62 or other electrical conductors such as row control signal 54 wires 62 and column data signal 52 wires 62 formed on a display substrate 10, for example by large-format photolithography, screen printing, or printed-circuit board construction and assembly techniques. Thus, pixel-substrate wires 62 on a pixel substrate 60 can be relatively fine, high-resolution wires 62 and wires 62 on a display substrate 10 (e.g., row control signal 54 wires 62, column data signal 52 wires 62, power 56 wires 62, and ground 58 wires 62) can be relatively coarse, low-resolution wires 62 compared to the relatively fine, high-resolution wires 62 on the pixel substrate 60. Pixel substrate 60 wires 62 can be fine interconnections, for example having a width of less than 50 µm, less than 20 µm, less than 10 µm, less than five µm, less than two µm, or less than one µm. Row control signal 54 wires 62, column data signal 52 wires 62, power 56 wires 62, and ground 58 wires 62 can include one or more crude lithography interconnections having a width from 2 µm to 2 mm. Therefore, in some embodiments of the present invention, high-resolution pixel substrates 60 are individually mounted on a display substrate 10 and micro-light-emitting elements 30 and pixel micro-controllers 40 are micro-devices individually mounted on each high-resolution pixel substrate 60.

Row control signal 54 wires 62, column data signal 52 wires 62, power 56 wires 62, and ground 58 wires 62 can each, separately, comprise metal or metal alloys or transparent metal oxides (for example deposited on the display substrate 10 or pixel substrate 60 by evaporation or sputtering and patterned using photolithographic methods). Row control signal 54 wires 62, column data signal 52 wires 62, power 56 wires 62, and ground 58 wires 62 can each, separately, be disposed on or in a single layer or on or in multiple (e.g., different) substrate layers of a display substrate 10 or pixel substrate 60 so that they do not electrically short on a surface of a display substrate 10 or pixel substrate 60. Vias can be provided to make electrical connections between devices or structures disposed on a display substrate 10 or pixel substrate 60 surface and row control signal 54 wires 62, column data signal 52 wires 62, power 56 wires 62, and ground 58 wires 62 in a display- or pixel-substrate layer below a display substrate 10 or a pixel substrate 60 surface.

Micro-transfer printing has the advantage of enabling use of a crystalline silicon substrate for a pixel micro-controller 40 that provides smaller higher-performance integrated circuit components than can be made in a layer of amorphous or polysilicon semiconductor available on a pixel substrate 60 or a large substrate such as a display substrate 10. In some embodiments, a display substrate 10 can include material, for example glass or plastic, different from a material in a semiconductor substrate (e.g., a pixel micro-controller 40 substrate), for example a semiconductor material such as silicon or a compound semiconductor. Such arrangements also have an advantage in that pixels 20 can be separately tested before they are located on the surface of a display substrate 10, thus improving yields and reducing costs.

Certain embodiments of the present invention comprise micro-light-emitting elements 30 (e.g., inorganic micro-light-emitting diodes, µILEDs) that enable a relatively small aperture ratio micro-light-emitting-diode display 99. In various embodiments, the combined light-emitting area of micro-light-emitting elements 30 or micro-light-emitting elements 30 themselves is less than or equal to 25%, 10%, 5%, 2%, 1%, 0.5%, 0.1%, 0.05%, or 0.01% of the display area or the minimum contiguous convex hull display area including all micro-light-emitting elements 30 on or over a display substrate 10. For example, µILEDs have been constructed having a planar size of 8×15 µm and area of 120 µm$^2$. In another example, a 4 k×2 k full color display can have 4096×2048×3 µILEDs (each having an area of 120 µm$^2$) equaling a total µILED area of 3020 mm$^2$. A micro-light-emitting-diode display 99 having a display substrate 10 one meter high by two meters long has an area of two square meters or 2,000,000 mm$^2$, so that only 3020/2,000,000=0.15% of the display substrate 10 area is covered with µILEDs. An exemplary 8 k×4 k display of the same size with same-sized µILEDs will still have less than 1% of the display substrate 10 area covered by µILEDs. Larger display areas or smaller µILEDs will result in smaller percentages. Thus, relatively small pixels 20 are well suited for use in displays according to certain embodiments of the present invention by providing a relatively large amount of free space in the display area of a display substrate 10.

In some embodiments of the present invention, µILEDs have light-emissive areas or a size of less than 10, 20, 50, or 100 square microns. Such µILEDs have the advantage of a small light-emissive area compared to their brightness as well as color purity providing highly saturated display colors and a substantially Lambertian emission providing a wide viewing angle for a micro-light-emitting-diode display 99 according to certain embodiments of the present invention. In various embodiments, a display area of a display substrate 10 is greater than or equal to eight times, ten times, twenty times, fifty times, one hundred times, two hundred times, five hundred times, one thousand, or ten thousand times the combined light-emissive areas of the µILEDs or areas of the µILEDs.

Methods of forming micro-transfer printable structures are described, for example, in the paper *Inorganic light-emitting diode displays using micro-transfer printing* (Journal of the Society for Information Display, 2017, DOI #10.1002/jsid.610, 1071-0922/17/2510-0610, pages 589-609) and U.S. Pat. No. 8,889,485. Micro-transfer printing using compound micro-assembly structures and methods can also be used with certain embodiments of the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety. Additional details useful in understanding and performing certain embodiments of the present invention are described in U.S. Pat. No. 9,520,537 filed Jun. 18, 2015, entitled Micro Assembled LED Displays and Lighting Elements, the disclosure of which is hereby incorporated by reference in its entirety.

An array of micro-light-emitting elements 30 or pixels 20 can define a display area on a display substrate surface, for example a convex hull area that includes all of the micro-light-emitting elements 30 or pixels 20, for example a rectangular display area. The words, "column" and "row", as well as "vertical" and "horizontal", "top" and "bottom", "up" and "down", or "left" and "right" are relative terms and can be interchanged in reference to different orientations of a micro-light-emitting-diode display 99 in accordance with certain embodiments of the present invention or pixel micro-controllers 40, pixels 20, pixel units 22, or micro-light-emitting elements 30 according to certain embodiments of the present invention.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Furthermore, the designations of "row" or "column" with respect to matrix addressing are arbitrary and can be exchanged.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

C center
$C_L$ center line
$D_E$, $D_{EA}$, $D_{EB}$ element distance
$D_L$ distance between adjacent micro-light-emitting elements in a pixel
$D_P$ pixel spacing/pixel separation/distance between adjacent pixels
$D_1$ first distance
$D_2$ second distance
H horizontal direction
L micro-light-emitting element length
M mid-point
P pixel pitch
$P_D$, $P_{DA}$, $P_{DB}$ pixel direction
$P_H$ horizontal pixel pitch
$P_V$ vertical pixel pitch
V vertical direction
W micro-light-emitting element width
10 display substrate
12 adhesive layer
14 column controller
16 row controller
18 display controller
20 pixel
20A first pixel
20B second pixel
22 pixel unit
24 redundant pixel unit location
26 zigzag pattern
30 micro-light-emitting element
30R red micro-light-emitting element
30G green micro-light-emitting element
30B blue micro-light-emitting element
40 pixel micro-controller
41 micro-controller
42 control circuit
44 memory
46 driver
50 contact pad
52 column data signal
54 row control signal
56 power
58 ground
60 pixel substrate
62 wire
64 tether
99 micro-light-emitting-diode display

What is claimed:

1. An active-matrix micro-light-emitting-diode display, comprising:
a display substrate;
pixels disposed in a pixel array on the display substrate, wherein each of the pixels comprises two or more micro-light-emitting elements that emit different colors of light; and
pixel micro-controllers disposed in a controller array on the display substrate, wherein each of the pixel micro-controllers is electrically connected to control the two or more micro-light-emitting elements in each of two or more adjacent pixels in the pixel array,
wherein in at least one dimension over the extent of the display substrate, a spatial separation between pixels in the two or more adjacent pixels in the pixel array or between adjacent pairs of pixels in the pixel array controlled by different ones of the pixel micro-controllers is
(i) greater than a spatial separation between the micro-light-emitting elements in at least one of the pixels in the pixel array, and
(ii) greater than a size of each of the two or more micro-light-emitting elements in at least one of the pixels in the pixel array, and
wherein, for each of the pixels, all of the two or more micro-light-emitting elements in the pixel are disposed in a common pixel direction orthogonal to a center line of the pixel micro-controller to which the two or more micro-light-emitting elements are electrically connected by an element distance substantially equal to or greater than one half of the extent of the pixel micro-controller in the common pixel direction from the center line, and the common pixel direction for each of the pixels controlled by a common one of the pixel micro-controllers is different.

2. The micro-light-emitting-diode display of claim 1, wherein the at least one dimension is two dimensions.

3. The micro-light-emitting diode display of claim 1, wherein the pixel micro-controllers are digital integrated circuit controllers.

4. The micro-light-emitting-diode display of claim 1, wherein each of the pixels comprises two micro-light-emitting elements that each emit a different color of light from any other micro-light-emitting element in the pixel, three micro-light-emitting elements that each emit a different color of light from any other micro-light-emitting element in the pixel, or four micro-light-emitting elements that each emit a different color of light from any other micro-light-emitting element in the pixel.

5. The micro-light-emitting-diode display of claim 1, wherein the two or more adjacent pixels comprises a first pixel and a second pixel,
- wherein the first pixel comprises only two micro-light-emitting elements, wherein the two micro-light-emitting elements of the first pixel are a first green micro-light-emitting element that emits green light and a red micro-light-emitting element that emits red light,
- wherein the second pixel comprises only two micro-light-emitting elements, wherein the two micro-light-emitting elements of the second pixel are a second green micro-light-emitting element that emits green light and a blue micro-light-emitting element that emits blue light.

6. The micro-light-emitting-diode display of claim 1, wherein the two or more adjacent pixels are two adjacent pixels, are three adjacent pixels, or are four adjacent pixels.

7. The micro-light-emitting-diode display of claim 1, wherein each of the pixel micro-controllers has a substantially rectangular shape with a center and a length greater than a width over the extent of the display substrate, the substantially rectangular shape comprising a first side opposing a second side in the length direction, the two or more adjacent pixels electrically connected to the pixel micro-controller comprise a first pixel and a second pixel, the first pixel is closer to the first side than to a point mid-way between the center and the first side, and the second pixel is closer to the second side than to a point mid-way between the center and the second side.

8. The micro-light-emitting-diode display of claim 1, wherein each of the pixel micro-controllers has a substantially rectangular shape or a plus shape with a center and a length and a width over the extent of the display substrate,
- the substantially rectangular shape or plus shape comprising a first side opposing a second side in a first dimension, the two or more adjacent pixels electrically connected to the pixel micro-controller comprise a first pixel and a second pixel, the first pixel is closer to the first side than to a point mid-way between the center and the first side, and the second pixel is closer to the second side than to a point mid-way between the center and the second side, and
- the substantially rectangular shape or plus shape further comprising a third side opposing a fourth side in a second dimension orthogonal to the first dimension, the two or more adjacent pixels further comprise a third pixel and a fourth pixel, the third pixel is closer to the third side than to the center, and the fourth pixel is closer to the fourth side than to the center, and wherein a distance between the first and second pixels is substantially the same as a distance between the third and fourth pixels.

9. The micro-light-emitting-diode display of claim 1, wherein each of the pixel micro-controllers has a substantially rectangular shape with a center and a length greater than a width over the extent of the display substrate, the substantially rectangular shape comprising a first side opposing a second side in the length direction, the two or more adjacent pixels electrically connected to the pixel micro-controller comprise a first pixel and a second pixel, the first pixel is closer to a point mid-way between the center and the first side than to the first side, and the second pixel is closer to a point mid-way between the center and the second side than to the second side.

10. The micro-light-emitting-diode display of claim 1, wherein each of the pixel micro-controllers and the two or more micro-light-emitting elements of each of the pixels are disposed directly on or adhered directly to the display substrate or to a layer formed on the display substrate.

11. The micro-light-emitting-diode display of claim 1, comprising pixel substrates arranged in an array on the display substrate, and wherein, for each of the pixels, the two or more micro-light-emitting elements and the pixel micro-controller electrically connected to control the pixel are disposed directly on or adhered directly to the pixel substrate or to a layer formed on the pixel substrate.

12. The micro-light-emitting-diode display of claim 11, wherein each of the pixel substrates comprises a fractured or separated tether.

13. The micro-light-emitting-diode display of claim 12, wherein each of the pixel micro-controllers comprises a fractured or separated tether or each of the two or more micro-light-emitting elements comprises a broken or separated tether, or both.

14. The micro-light-emitting-diode display of claim 1, wherein the two or more micro-light-emitting elements of each pixel are disposed directly on or adhered directly to the pixel micro-controller, or to a layer formed on the pixel micro-controller, that is electrically connected to and controls the micro-light-emitting elements of the pixel.

15. The micro-light-emitting-diode display of claim 1, wherein, for each of the pixel micro-controllers, the pixel micro-controller and the two or more micro-light-emitting elements of the two or more adjacent pixels electrically connected to and controlled by the pixel micro-controller are a pixel unit, and
- wherein each pixel unit is separated from an adjacent pixel unit in a separation direction by a distance greater than or equal to a size of the pixel unit in the separation direction so that space is provided for a redundant pixel unit location between the pixel unit and the adjacent pixel unit over the display substrate in the separation direction.

16. The micro-light-emitting-diode display of claim 1, wherein, for each of the pixel micro-controllers, the pixel micro-controller and the two or more micro-light-emitting elements of the two or more adjacent pixels electrically connected to and controlled by the pixel micro-controller are a pixel unit and
- wherein the pixel units are closer together than the pixels over the display substrate in a same direction.

17. The micro-light-emitting-diode display of claim 1, wherein each of the pixel micro-controllers has an area over the display substrate that is larger than a combined area of each micro-light-emitting element of the two or more adjacent pixels electrically connected to and controlled by the pixel micro-controller.

18. The micro-light-emitting-diode display of claim 1, wherein each of the pixel micro-controllers has an area over the display substrate that is larger than a combined area of the two or more adjacent pixels electrically connected to and controlled by the pixel micro-controller.

19. The micro-light-emitting-diode display of claim 1, wherein the pixels each have a non-unitary aspect ratio and wherein some of the pixels are rotated with respect to others of the pixels,
- wherein each of the micro-light-emitting elements in the pixels has a non-unitary aspect ratio and wherein some of the micro-light-emitting elements in the pixels are rotated with respect to others of the micro-light-emitting elements in the pixels, or wherein each of the pixel micro-controllers and the micro-light-emitting elements in the pixels or the pixels electrically connected to and controlled by the micro-controller have a non-unitary aspect ratio and wherein at least some of the micro-light-emitting elements in the pixels are rotated with respect to the pixel micro-controller.

20. The micro-light-emitting-diode display of claim 1, wherein the pixels in the array are disposed in rows and columns and the rows are aligned and the columns are aligned, or wherein the pixels in the array are disposed in rows and columns and alternating rows are offset in a row direction or alternating columns are offset in a column direction, or both.

21. The micro-light-emitting-diode display of claim 1, wherein each of the pixel micro-controllers and the pixels and micro-light-emitting elements in the two or more adjacent pixels electrically connected to and controlled by the pixel micro-controller are a pixel unit, and wherein the pixels in the pixel array are disposed in rows and columns, each column of pixels forms a zigzag pattern, adjacent columns are mirror reflections of each other, and a distance between pixels in a pixel unit is less than a distance between pixels in adjacent pixel units in a same direction.

22. The micro-light-emitting-diode display of claim 1, wherein, for each pixel micro-controller, the two or more adjacent pixels comprise first and second pixels, and comprising contact pads disposed substantially in a line between the first and second pixels.

23. The micro-light-emitting-diode display of claim 1, wherein each pixel micro-controller comprises pixel portions that each exclusively controls a pixel electrically connected to the pixel micro-controller, and a shared portion that provides control in common to all of the two or more adjacent pixels electrically connected to the pixel micro-controller.

24. The micro-light-emitting-diode display of claim 23, wherein the shared portion comprises contact pads for receiving or providing electrical control signals.

25. The micro-light-emitting-diode display of claim 1, wherein each micro-light-emitting element has at least one of (i) a width from 2 to 100 µm, (ii) a length from 2 to 250 µm, and (iii) a thickness from 2 to 50 µm.

26. The micro-light-emitting-diode display of claim 1, wherein each micro-light-emitting element of the two or more micro-light-emitting elements in at least one of the two or more adjacent pixels is an inorganic micro-light-emitting diode.

27. The micro-light-emitting-diode display of claim 1, wherein each micro-light-emitting element of the two or more micro-light-emitting elements in at least one of the two or more adjacent pixels is an organic light-emitting diode.

28. The micro-light-emitting-diode display of claim 1, wherein at least one of the micro-light-emitting elements of the two or more micro-light-emitting elements in at least one of the two or more adjacent pixels is an inorganic micro-light-emitting diode and at least one of the micro-light-emitting elements of the two or more micro-light-emitting elements in the one of the two or more adjacent pixels commonly controlled by a pixel micro-controller is an organic micro-light-emitting diode.

29. The micro-light-emitting-diode display of claim 28, wherein the pixels each comprise three micro-light-emitting elements, a micro-light-emitting element that is a red organic micro-light-emitting diode that emits red light, a micro-light-emitting element that is a green organic micro-light-emitting diode that emits green light, and a micro-light-emitting element that is a blue inorganic micro-light-emitting diode that emits blue light.

30. The micro-light-emitting-diode display of claim 28, wherein the two or more adjacent pixels comprises a first pixel and a second pixel of the two or more adjacent pixels, wherein the first pixel comprises a red organic micro-light-emitting diode that emits red light and a green organic micro-light-emitting diode that emits green light and wherein the second pixel comprises a blue inorganic micro-light-emitting diode that emits blue light and a green organic micro-light-emitting diode that emits green light.

31. The micro-light-emitting-diode display of claim 30, wherein the first pixel comprises only two micro-light-emitting elements, wherein the two micro-light-emitting elements of the first pixel are the red organic micro-light-emitting diode and the green organic micro-light-emitting diode, wherein the second pixel comprises only two micro-light-emitting elements, wherein the two micro-light-emitting elements of the second pixel are the blue inorganic micro-light-emitting diode and the green organic micro-light-emitting diode.

32. The micro-light-emitting-diode display of claim 1, wherein the pixels each have a non-unitary aspect ratio and wherein some of the pixels are rotated with respect to others of the pixels.

33. The micro-light-emitting-diode display of claim 1, wherein each of the micro-light-emitting elements in the pixels has a non-unitary aspect ratio and wherein some of the micro-light-emitting elements in the pixels are rotated with respect to others of the micro-light-emitting elements in the pixels.

34. The micro-light-emitting-diode display of claim 1, wherein the pixels in the array are disposed in rows and columns and alternating rows are offset in a row direction or alternating columns are offset in a column direction, or both.

35. The micro-light-emitting-diode display of claim 1, wherein at least two micro-light-emitting element in each of the pixels emit a common color of light.

* * * * *